(12) United States Patent
Lee

(10) Patent No.: US 9,224,485 B2
(45) Date of Patent: Dec. 29, 2015

(54) NONVOLATILE MEMORY DEVICE AND METHOD OF PROGRAMMING THE SAME MINIMIZING DISTURBANCE FROM ADJACENT CELLS

(71) Applicant: SAMSUNG ELECTRONICS CO., LTD., Gyeonggi-do (KR)

(72) Inventor: Changhyun Lee, Gyeonggi-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 247 days.

(21) Appl. No.: 13/734,247

(22) Filed: Jan. 4, 2013

(65) Prior Publication Data

US 2013/0176792 A1    Jul. 11, 2013

(30) Foreign Application Priority Data

Jan. 9, 2012    (KR) ........................ 10-2012-0002555

(51) Int. Cl.
G11C 11/56       (2006.01)
G11C 16/14       (2006.01)
G11C 16/04       (2006.01)

(52) U.S. Cl.
CPC ............ *G11C 16/14* (2013.01); *G11C 11/5628* (2013.01); *G11C 11/5642* (2013.01); *G11C 16/0483* (2013.01)

(58) Field of Classification Search
CPC ........... G11C 16/3418; G11C 16/3409; G11C 13/0033; G11C 13/0097; G11C 11/5628
See application file for complete search history.

(56) References Cited

U.S. PATENT DOCUMENTS

| 6,314,026 | B1* | 11/2001 | Satoh et al. ............... 365/185.24 |
| 7,499,338 | B2 | 3/2009 | Ito |
| 7,639,539 | B2 | 12/2009 | Cho et al. |
| 7,684,250 | B2 | 3/2010 | Chae |
| 7,813,171 | B2 | 10/2010 | Shibata et al. |
| 7,894,269 | B2 | 2/2011 | Li |
| 8,059,466 | B2 | 11/2011 | Lee et al. |
| 2007/0253249 | A1* | 11/2007 | Kang et al. ............... 365/185.03 |
| 2010/0020602 | A1 | 1/2010 | Baek et al. |
| 2011/0044104 | A1* | 2/2011 | Kang et al. ............... 365/185.03 |
| 2012/0008413 | A1* | 1/2012 | Jeong ........................ 365/185.24 |
| 2012/0069667 | A1* | 3/2012 | Shirakawa ............... 365/185.17 |

FOREIGN PATENT DOCUMENTS

| JP | 2007-188634 | 7/2007 |
| JP | 2007-305204 | 11/2007 |
| JP | 2010539630 | 12/2010 |
| JP | 2011-060423 | 3/2011 |
| KR | 1020070022720 | 2/2007 |

(Continued)

*Primary Examiner* — Richard Elms
*Assistant Examiner* — Ajay Ojha
(74) *Attorney, Agent, or Firm* — F. Chau & Associates, LLC

(57) ABSTRACT

A nonvolatile memory device and a method of programming the same. The nonvolatile memory device includes a memory cell array including a plurality of memory cells and a program control logic circuit controlling the memory cell array. The program control logic circuit programs a first memory cell so that the threshold voltage of the first memory cell corresponding to data of erasure state is higher than the threshold voltage of a second memory cell corresponding to data of program state, in the memory cell array. The nonvolatile memory device controlled in this manner can provide higher reliability.

16 Claims, 26 Drawing Sheets

(56) References Cited

FOREIGN PATENT DOCUMENTS

| KR | 1020080084230 | 9/2008 |
| KR | 1020080107921 | 12/2008 |
| KR | 1020100011198 | 2/2010 |
| KR | 1020100080896 | 7/2010 |
| KR | 1020100096862 | 9/2010 |
| KR | 1020110020531 | 3/2011 |

* cited by examiner

Erase cell which would be remained at state E1

Erase cell which would be programed to state E2

NONVOLATILE MEMORY DEVICE AND METHOD OF PROGRAMMING THE SAME MINIMIZING DISTURBANCE FROM ADJACENT CELLS

CROSS-REFERENCE TO RELATED APPLICATIONS

This U.S. non-provisional patent application claims priority under 35 U.S.C. §119 of Korean Patent Application No. 10-2012-0002555, filed on Jan. 9, 2012, the entire contents of which are hereby incorporated by reference.

BACKGROUND OF THE INVENTIVE CONCEPT

1. Technical Field

The present inventive concept herein relates to memory devices, and more particularly, to a nonvolatile memory device and a method of programming the same.

2. Discussion of the Related Art

Semiconductor memory devices are classified into volatile memory devices and nonvolatile memory devices. The volatile memory devices have a high read speed and a high write speed. However, the volatile memory devices lose their stored data when their power supplies are interrupted. The nonvolatile memory devices maintain their stored data even when their power supplies are interrupted. Thus, the nonvolatile memory devices are used to remember contents that should be preserved regardless of whether their power is supplied or not.

A flash memory is a type among nonvolatile memories and has a feature of electrically erasing cell data in a block erase operation, and it is thus widely used in computers and memory cards. Each of memory cells of the flash memory device stores 1-bit data or multi-bit data. When 1-bit data is stored in one memory cell, the memory cell has a threshold voltage corresponding to one of two threshold voltage states. When 2-bit data are stored in one memory cell, the memory cell has a threshold voltage corresponding to one of four threshold voltage states. Recently, various technologies to store four or more bit data in one memory cell are actively being studied.

FIG. 1 is a block diagram of a conventional nonvolatile memory device 100. Referring to FIG. 1, the nonvolatile memory device 100 includes a memory cell array 110, an address decoder 120, a data input/output circuit 130, a program control logic circuit 140 and a voltage generator 150.

The memory cell array 110 includes memory cells and each memory cell is connected to a bit line and a word line. If one-bit data is stored in one memory cell then the memory cell is called a single level cell (SLC). If two or more bits of data may be stored in one memory cell then the memory cell is called a multi level cell (MLC). The multi level cell (MLC) has to be densely programmed to include threshold voltage states corresponding to the multiple bits being stored within a limited threshold voltage window. Thus, in the case of multi level cells, the reliability of data may be degraded due to interference between cells.

The address decoder 120 selects a word line in response to address information. The address decoder 120 transfers various sorts of word line voltages provided from the voltage generator 150 to the currently selected word line and adjacent wordlines. When a programming operation is performed, the address decoder 120 transfers a program voltage Vpgm of about 15~20V and a verification voltage Vvfy to the currently-selected word line and transfers a pass voltage Vpass to an unselected word line. When a read operation is performed, the address decoder 120 transfers a selected read voltage Vrd provided from the voltage generator 160 to the currently selected word line and transfers an unselected read voltage Vread of about 5V to the unselected word lines of the same NAND string.

The data input/output circuit 130 is coupled to the memory cell array 110 through the bit lines. The data input/output circuit 130 receives data DATA from the outside and stores the received data in the memory cell array 110. The data input/output circuit 130 reads data DATA stored in the memory cell array 110 and transfers the read data to the outside. The data input/output circuit 130 may include well known constituent elements such as a column select gate, a page buffer, a data buffer, etc. The data input/output circuit 130 may also include well known constituent elements such as a column select gate, a write driver, a sense amplifier, a data buffer, etc.

The program control logic circuit 140 controls the overall operation of the nonvolatile memory device 100 according to a conventional programming method.

The voltage generator 150 generates a DC (direct current) voltage according to a control of the program control logic circuit 140. The voltage generator 150 provides a DC voltage for programming of the nonvolatile memory device 100 in response to a control of the program control logic circuit 140.

FIG. 2 is a circuit diagram of an exemplary implementation of the memory cell array 110 of FIG. 1 in detail. For convenience of description, it is assumed that the memory cell array 110 is implemented with flash memory cells connected to bit lines and word lines the NAND string configuration. Referring to FIG. 2, the memory cell array 110 includes a plurality of string select transistors SST, a plurality of ground select transistors GST and a plurality of flash memory cells MCers, MCw1, MCw2, MCb1, MCb2 and MCd1~MCd4.

The gate of each string select transistor SST is coupled to the address decoder 120 through a string select line SSL and the drain of each select transistor SST is coupled to the data input/output circuit 130 through corresponding bit line among bit lines BL1~BLn. The gate of each ground select transistor GST is coupled to the address decoder 120 through the ground select line GSL.

A page of flash memory cells is coupled to each output of the address decoder 120 through a corresponding word line among the word lines WL1~WLm. In a single level cell (SLC) method, one bit is stored in one memory cell, and the set of flash memory cells connected to one word line constitutes a page. In a multi level cell (MCL) method, a plurality of n bits is stored in one memory cell, and the set of memory cells connected to one word line may constitute a plurality of n pages.

FIG. 3 is a drawing illustrating an example of a conventional threshold voltage distribution of the flash memory cells in FIG. 2. Referring to FIG. 3, the threshold voltage distribution of multi level cell MCL (having 2-bit data stored in each one memory cell) is shown as an illustration.

An erasure state E corresponding to data '11' has the lowest threshold voltage level. Program states of the 2-bit data are arranged by a program state P1 corresponding to data '01', a program state P2 corresponding to data 10 and a program state P3 corresponding to data 00.

The threshold voltage of each memory cell may be affected by the program state of each adjacent memory cell. The threshold voltage of a memory cell may become high or low by a program disturb or by a coupling effect. The threshold voltage of a memory cell in an erasure state may rapidly become higher according to a program state of adjacent memory cell.

If the first memory cell is programmed, the threshold voltage distribution of memory cells forms the distributions illustrated by a solid line. However, by a coupling or program disturb phenomenon according to the programming of adjacent cells, the distributions illustrated by a solid line may shift to the threshold distribution illustrated by a dotted line. The threshold voltage distribution of memory cells in an erasure state E1 may be rapidly widen according to a program state of adjacent memory cells.

Adjacent cells MCw1 and MCw2 in a word line direction, adjacent cells MCb1 and MCb2 in a bit line direction and adjacent cells MCd1~MCd4 in a diagonal direction are disposed around the memory cell MCers in an erasure state.

In the case that adjacent cells are programmed, the effective threshold voltage of the memory cell (MCers) in an erasure state increases in proportion to a change of threshold voltages of the adjacent cells by a coupling phenomenon. In the case that the threshold voltage of the adjacent cells MCw1 and MCw2 in a word line direction increases by a predetermined level ($\Delta V$), the threshold voltage of the memory cell (MCers) in an erasure state increases by a word line coupling phenomenon. In the case that the threshold voltage of the adjacent cells MCb1 and MCb2 in a bit line direction or the threshold voltage of the adjacent cells MCd1~MCd4 in a diagonal direction increases by a predetermined level ($\Delta V$), the threshold voltage of the memory cell (MCers) in an erasure state increases by a bit line coupling or a coupling of diagonal direction.

Besides, the threshold voltage of the memory cell MCers in an erasure state may be increased by a program disturb phenomenon. Thus, as illustrated in FIG. 3, a distribution of threshold voltage of the erasure state E1 may be rapidly widen and when performing a read operation, a read failure with respect to memory cell that belongs to may occur.

SUMMARY OF THE INVENTIVE CONCEPT

An aspect of the inventive concept provides a nonvolatile memory device. An exemplary embodiment of the nonvolatile memory device includes a memory cell array comprising a plurality of memory cells including a first memory cell and a second memory cell; and a program control logic circuit for controlling the memory cell array. If the first and second memory cells are adjacent, then the program control logic programs the first memory cell and the second memory cell so that the threshold voltage of the first memory cell (among the plurality of memory cells) corresponding to the erased state is higher than the threshold voltage of the second memory cell corresponding to data of a first program state.

An aspect of the inventive concept provides a method of programming a nonvolatile memory device. The method may include programming a first memory cell (among memory cells that belong to a first erasure state) to a first program state higher than the threshold voltage of the first erasure state; and programming a second memory cell corresponding to data of erasure state (among memory cells that belong to the first erasure state) to a second erasure state higher than the threshold voltage of the first program state.

An aspect of the inventive concept provides a method of reading a nonvolatile memory device. When a read operation is performed, the voltage generator 150 generates four selected read voltages Vr1~Vr4 and the program control logic circuit 140 controls so that the four selected read voltages Vr1~Vr4 are provided to the selected word line. As described in FIG. 10, in the present embodiment of the inventive concept, the threshold voltage of 2-bit multi level bit corresponds to any one state of five states E1, E2, P1, P2 and P3. Thus, a read operation may be performed by applying the four selected read voltages Vr1~Vr4.

The method of reading assumes nonvolatile memory device having a plurality of wordlines connected to nonvolatile memory cells having five states including two erase states E1 and E2, and three program states P1, P2 and P3, and the method comprises: generating four selected read voltages Vr1, Vr2, Vr3 and Vr4 (wherein Vr1<Vr2<Vr3<Vr4) and selectively (e.g., sequentially) applying the four read voltages Vr1, Vr2, Vr3 and Vr4 to a currently-selected word line (e.g., in the time sequence of Vr3, Vr2, Vr1, and Vr4 as shown in FIG. 10) for detecting in which among the five states E1, E2, P1, P2 and P3, is each nonvolatile memory cell connected to the currently-selected wordline.

Exemplary embodiments of inventive concepts will be described more fully hereinafter with reference to the accompanying drawings, in which embodiments of the invention are shown.

Preferred embodiments of the inventive concept will be described below in more detail with reference to the accompanying drawings. The embodiments of the inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the figures, like numbers refer to like elements throughout, and.

DETAILED DESCRIPTION OF THE EXEMPLARY EMBODIMENTS

Hereinafter, a NAND type flash memory device is used as a nonvolatile memory device to describe a characteristic and a function of the inventive concept. A 'distribution' means the number of memory cells corresponding to the threshold voltage in memory cells of specific unit (page, block, chip). The term "adjacent cell" with respect to the selected memory cell is used to describe a technical characteristic of the inventive concept. The adjacent cell means memory cell connected to a word line adjacent to the selected memory cell or memory cells connected to a bit line adjacent to the selected memory cell.

Figure 1:
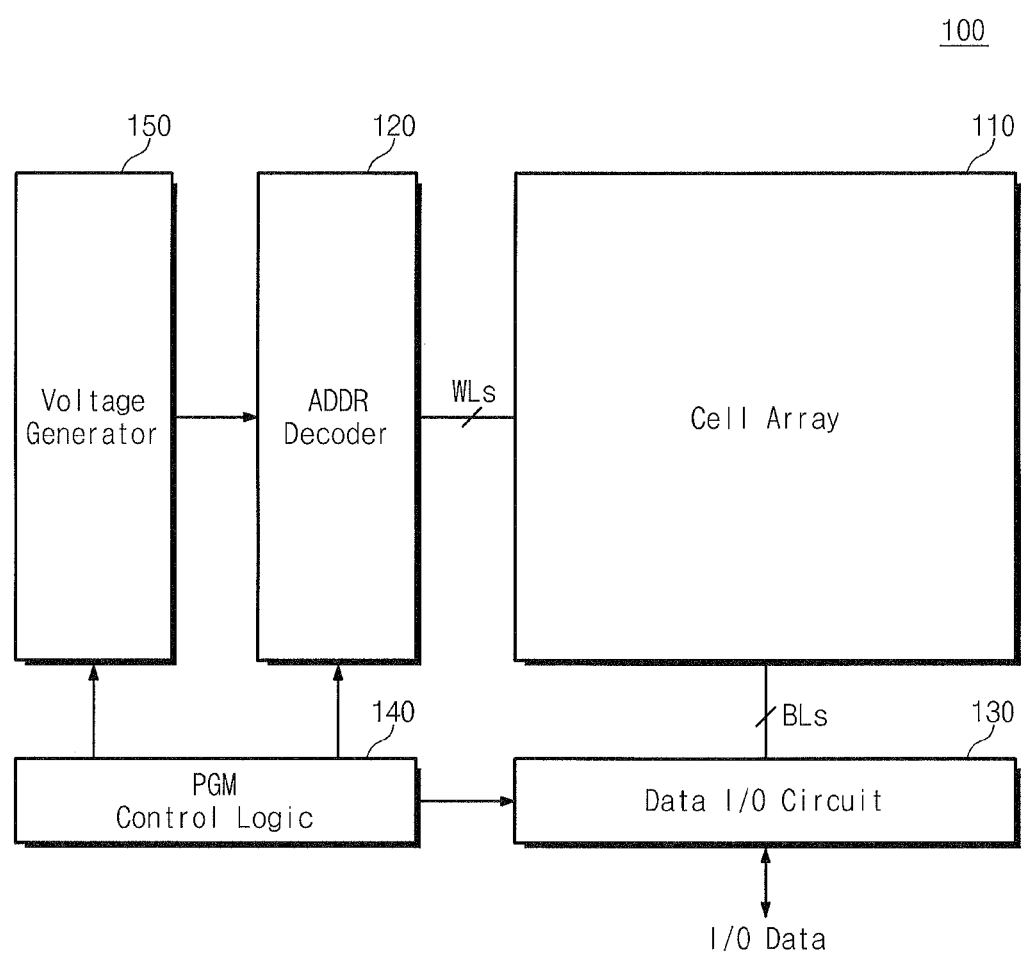
FIG. 1 is a block diagram of a conventional nonvolatile memory device. The conventional nonvolatile memory device of FIG. 1 can be adapted to operate in accordance with some exemplary embodiments of the inventive concept.
Figure 2:
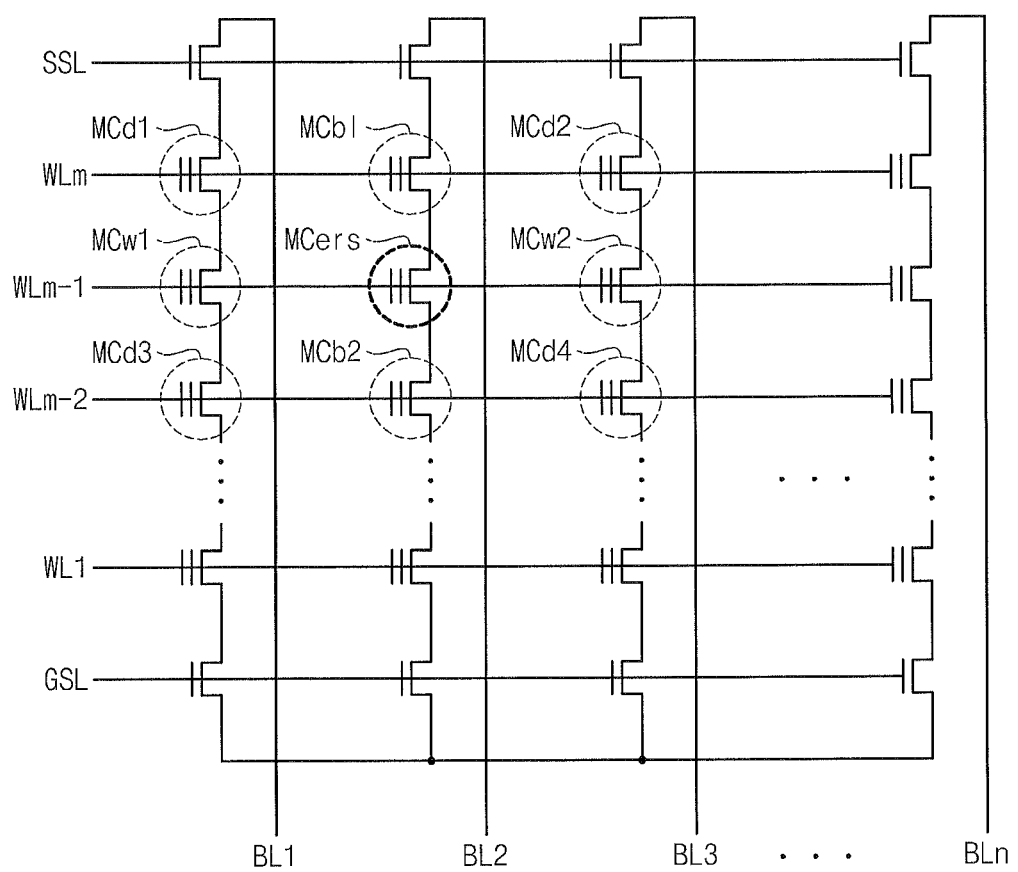
FIG. 2 is a circuit diagram of a conventional implementation of the memory cell array in the conventional nonvolatile memory device of FIG. 1.

I. A Nonvolatile Memory Device Having its Threshold Voltage of the Erasure State Higher Than its Threshold Voltage of Program State According to aspect of the invention there is provided method of programming that solves the above described problems of coupling and program disturb, and the nonvolatile memory device 100 of FIG. 1 is adapted to program memory cells in an erasure state so that the threshold voltage of the erasure state is higher than the threshold voltage of program state. Thus, the nonvolatile memory device 100 of FIG. 1 is adapted so that the threshold voltage of the erasure state is set to be higher than the threshold voltage of program state.

In an exemplary embodiment of the invention, the conventional nonvolatile memory device of FIG. 1. is adapted to perform a programming method according to an embodiment of the invention. FIG. 1 is a block diagram of a nonvolatile memory device 100 to be adapted to perform a method of programming in accordance with some exemplary embodiments of the inventive concept. In an exemplary embodiment of the invention, the program control logic 140 is modified to perform programming of memory cells in the nonvolatile memory device 100 according to a programming method in accordance with some embodiments of the inventive concept. When a programming operation is performed, the adapted program control logic 140 programs memory cells of the erasure state so that the threshold voltage of the erasure state is set to be higher than the threshold voltage of a program state. The adapted program control logic 140 selects predetermined memory cells among memory cells of the erasure state and programs the selected memory cells so that threshold voltages of the selected memory cells are set to be higher than the threshold voltage of a program state.

The nonvolatile memory device 100 of FIG. 1 may be thereby adapted to program memory cells in an erasure state so that the threshold voltage of the erasure state is higher than the threshold voltage of a program state. Thus, a read fail caused by an increase of threshold voltage of memory cells in an erasure state may be prevented.

Figure 3:
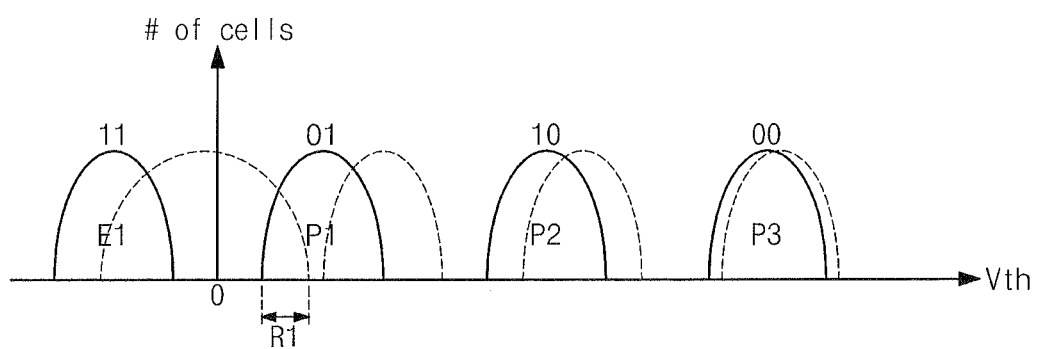
FIG. 3 is a drawing illustrating a conventional threshold voltage distribution of the flash memory cells in FIG. 2.

In the case that memory cells are used as a multi-level cell, the threshold voltage of the erasure state may be set to be higher than at least one threshold voltage among threshold voltages of program states. Referring to FIG. 3, the threshold voltage of the erasure state in accordance with some embodiments of the inventive concept may be set to be higher than at least one threshold voltage among threshold voltages of the first, second and third program states (P1, P2, P3).

In this case, since the threshold voltage of the erasure state is higher than the threshold voltage of program state, an increase of threshold voltage of memory cells of erasure state may be minimized. A distribution of memory cells of programmed erasure state may be formed to be narrow by step of programming memory cells of erasure state.

It is assumed that the memory cell array 110 is implemented with a flash memory as nonvolatile memory cells. However, this is only an illustrative example, the memory cell array 110 may be implemented with various other nonvolatile memory devices. For example, the memory cell array 110 may be implemented using a magnetic RAM, a spin-transfer torque MRAM, a conductive bridging RAM, a ferroelectric RAM, a phase RAM called an ovonic unified memory, a resistive RAM or Re-RAM, a nanotube RAM, a polymer RAM, a nano floating gate memory, a holographic memory, a molecular electronics memory or an insulator resistance change memory.

Figure 4:
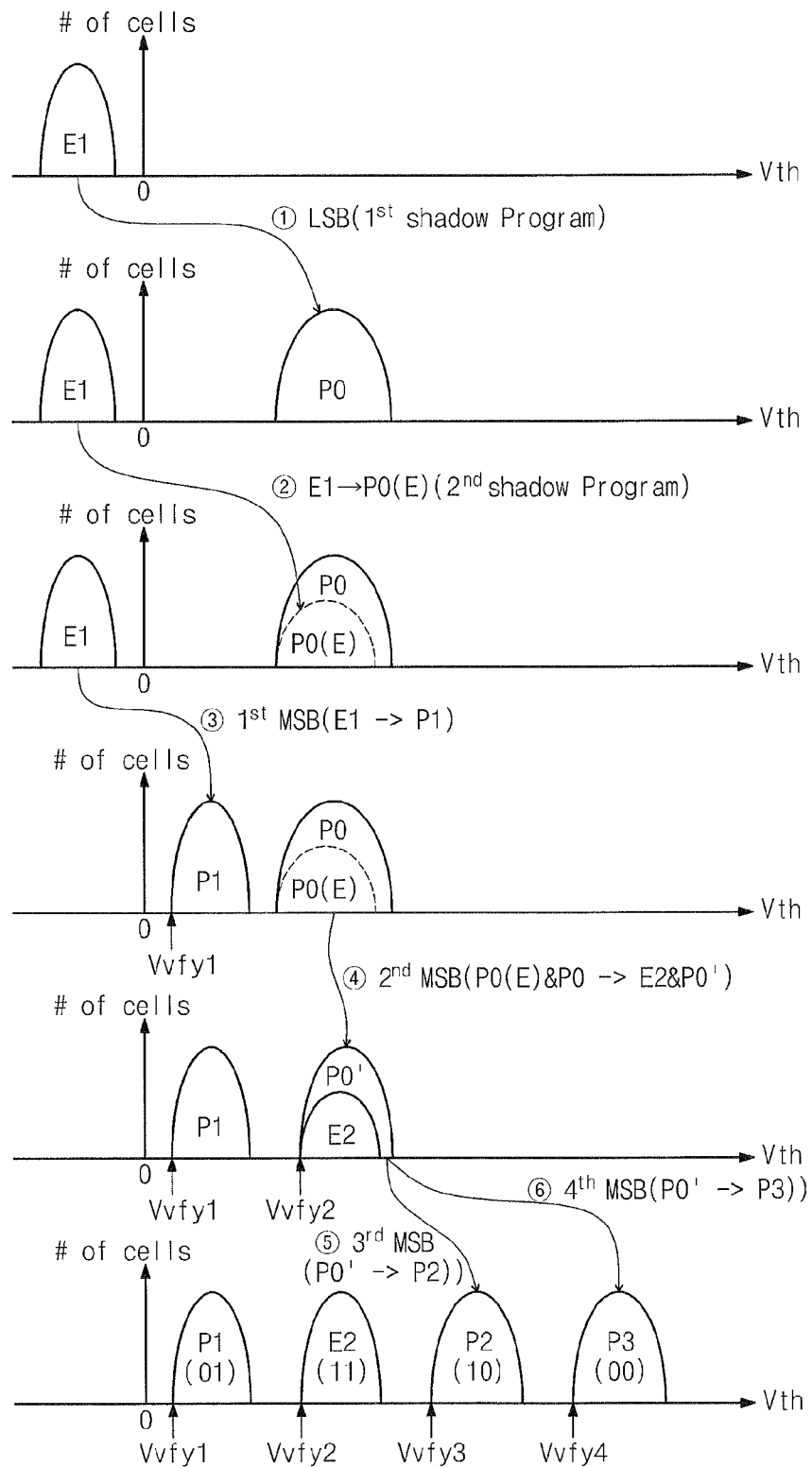
FIG. 4 is a drawing illustrating threshold voltage distributions to describe a method of programming the nonvolatile memory device of FIG. 1 according to an exemplary embodiment of the inventive concept.

FIG. 4 is a drawing illustrating threshold voltage distributions to describe a method of programming the nonvolatile memory device 100 of FIG. 1 according to an exemplary embodiment of the inventive concept. In FIG. 4, the horizontal axis represents the threshold voltage Vth and the vertical axis represents the number of memory cells having each threshold voltage Vth. For convenience of description, in FIG. 4, a programming method of 2-bit multi level cell MLC will be described. Here, the relationship between the states E1, P1, P2 and P3 and 2-bit data is only an example illustrated. The states E1, P1, P2 and P3 and 2-bit data corresponding thereto may be variously changed depending on a design method of a memory device. Although 2-bit MLC is illustrated as an example for convenience of description, the same technical features may be applied to a 3-bit MLC or a 0-bit MLC.

Referring to FIG. 4, the nonvolatile memory device 100 performs a programming method so that memory cells have threshold voltages corresponding to the first through third program states (P1, P2, P3) or a second erasure state (E2) respectively. In this case, the threshold voltage of the second erasure state (E2) is higher than the first program state P1 and is lower than the second program state P2.

First, the least significant bit (LSB) program step is performed on memory cells of the first erasure state E1. Thus, among the memory cells of the first erasures state E1, memory cells to be programmed to the second program state P2 or the third program state P3 are programmed to a shadow program state (P0). Memory cells that belong to the shadow program state P0 are programmed to the second program state P2 or the third program state P3 when performing the most significant bit (MSB) program step. Thus, the least significant bit (LSB) program step may be called a first shadow program operation.

After that, among the memory cells of the first erasure state E1, memory cells to be programmed to the second erasure state E2 are programmed to a shadow erasure state P0(E). Memory cells that belong to the shadow erasure state P0(E) are programmed to the second program state E2 when performing the most significant bit (MSB) program step. Thus, step of being programmed to the shadow erasure state P0(E) may be called a second shadow program operation. In this case, as illustrated in FIG. 4, the same verification voltage level may be used so that the shadow program state P0 and the shadow erasure state P0(E) have the same threshold voltage distribution.

After the first and second shadow program steps are performed, the most significant bit (MSB) program step is performed. First, memory cells that belong to the first erasure state E1 are programmed to the first program state P1. Memory cells that belong to the first erasure state E1 are programmed to the first program state P1 is performed using a first verification voltage Vvfy1 and the operation may be called a first most significant bit (MSB) program step.

After that, step of programming memory cells that belong to the shadow program state P0 and the shadow erasure state P0(E) to a prime shadow program state P0' and the second erasure state E2 respectively. This step is performed using a second verification voltage Vvfy2 and may be called a second significant bit (MSB) program step.

After that, step of programming memory cells that belong to the prime shadow program state P0' to the second program state P2 or the third program state P3 is performed. The step of programming the memory cells to the second program state P2 may called a third MSB program step and the step of programming the memory cells to the third program state P3 may be called fourth MSB program step. According to a series of program process, each of memory cells may be programmed to have the threshold voltage corresponding to one state among the first through third program states P1, P2 and P3 and the second erasure state E2.

Figure 5:
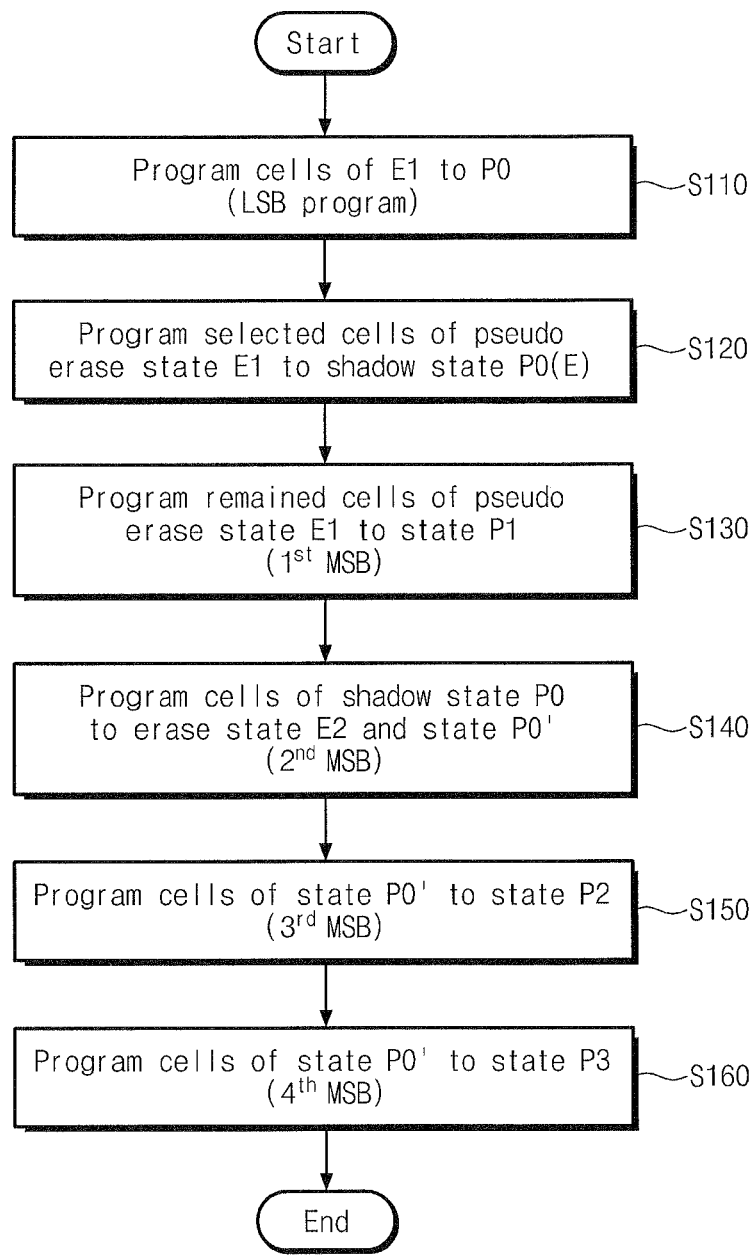
FIG. 5 is a flow chart illustrating an exemplary embodiment of the method described in FIG. 4 of programming of the nonvolatile memory device of FIG. 1.

FIG. 5 is a flow chart illustrating an embodiment of the method of programming the nonvolatile memory device 100 described in FIG. 4.

In step S110, the most significant bit program step is performed. Thus, among memory cells of the first erasure state E1, memory cells to be programmed to the second and third program states P2 and P3 are programmed to the shadow program state P0.

In step S120, among memory cells of the first erasure state E1, memory cells to be programmed to the second program state P2 are programmed to the shadow erasure state P0(E). In this case, in the first erasure state E1, only cells to be programmed to the first program state P1 exist. Also, since data is not given to the first erasure state E1, the first erasure state E1 may be called a pseudo erasure state.

In step S130, the first MSB program step is performed that programs memory cells remaining in the first erasure state E1 to the first program state P1.

In step S140, step is performed that programs memory cells that belong to the shadow program state P0 and memory cells that belong to the shadow erasure state P0(E) to the prime shadow program state P0' and the second erasure state E2 respectively. This step is performed using the same verification voltage and may be called the second MSB bit program step.

In step S150, the third MSB program step is performed that programs memory cells that belong to the prime shadow program state P0' to the second program state P2. In step S160, the fourth MSB program step is performed that programs memory cells that belong to the prime shadow program state P0' to the third program state P3.

As described above, the nonvolatile memory device 100 programs memory cells to one state among the first through third program states P1, P2 and P3 and the second erasure state E2. Thus, unlike a conventional case of FIG. 3, the nonvolatile memory device 100 performs a programming operation on memory cells corresponding to data '11' of an erasure state.

In this case, while memory cells that belong to the shadow program state P0(E) are programmed to the second erasure state E2, the threshold voltage distribution of the memory cells may become narrow. Also, since amplitudes of threshold voltages corresponding to the second erasure state E2, the second program state P2 and the third program state P3 are small, a distribution change of memory cells due to a coupling phenomenon may be minimized.

The aforementioned description is an example and the technical spirit of the inventive concept is not limited thereto. For example, memory cells to which data '11' of erasure state is given, only predetermined memory cells may be programmed from the first erasure state E1 to the second erasure state E2. In FIGS. 6 through 10, another embodiment of the inventive concept will be described which performs the second shadow program only on the selected memory cells among the memory cells of the first erasure state E1.

Figure 6:
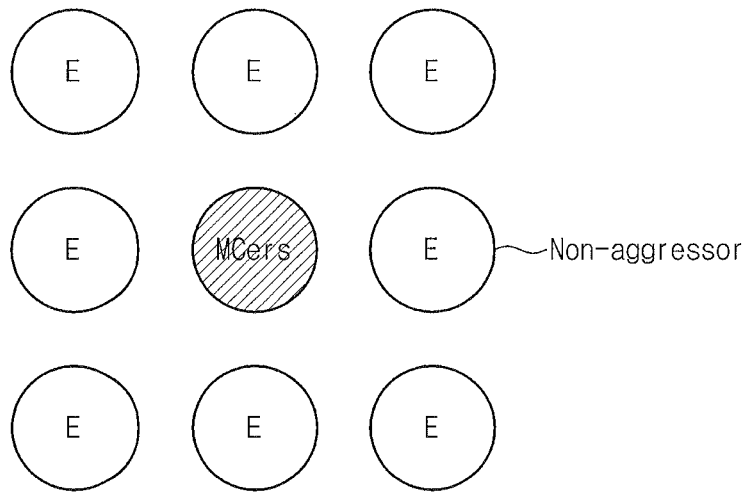
FIGS. 6 and 7 are drawings showing a memory cell at erase state and adjacent memory cells in accordance with an exemplary embodiment of the inventive concept.
Figure 7:
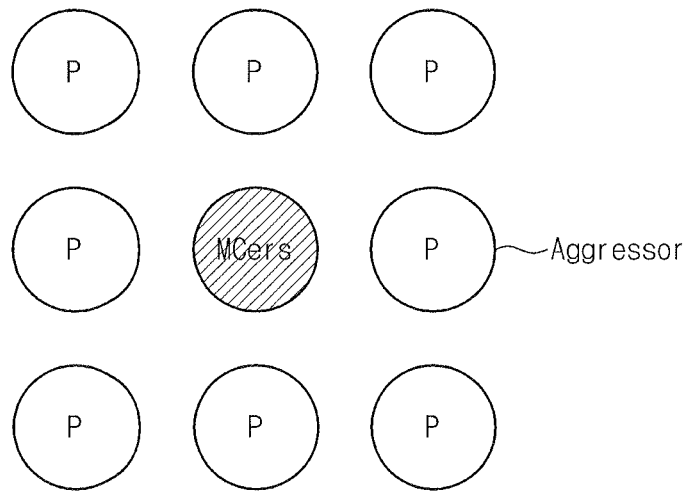

II. A Nonvolatile Memory Device That Does Not Perform the Second Shadow Program Operation on Memory Cell of Erasure State Adjacent to at Least One Aggressor (Aggressing) Cell FIGS. 6 and 7 are drawings showing a memory cell at erase state and adjacent memory cells in accordance with an exemplary embodiment of the inventive concept. For convenience of description, it is assumed that in FIG. 6, memory cells adjacent to memory cell MCers of erasure state maintains an erasure state E and it is assumed that in FIG. 7, memory cells adjacent to memory cell MCers of erasure state are programmed to a program state P. Here, the program state P is any one of the first, second and third program states P1, P2 and P3.

Referring to FIGS. 6 and 7, memory cells adjacent to the memory cell MCers of erasure state may be classified into an aggressor (aggressing) cell and a non-aggressor (non-aggressing) cell. The aggressor cell is a memory cell providing relatively great interference (e.g., coupling or program disturb) to adjacent memory cells. The aggressor cell may be a memory cell disposed nearest to the memory cell of erasure state in a bit line direction and being programmed to a program state having the highest threshold voltage among the program states. The aggressor cell may be a memory cell disposed nearest to memory cell of erasure state in a word line direction and being programmed to a program state having the highest threshold voltage among the program states.

A non-aggressor cell is a memory cell providing no interference or relatively small interference as compared with an aggressor cell. Classification standard of the aggressor cell and non-aggressor cell may be changed or controlled based on an operation condition, a program method and the order of memory device, the change of environment and the user intention.

Referring back to FIG. 6, memory cells adjacent to the memory cell MCers of erasure state maintain an erasure state E. Thus, the memory cells adjacent to the memory cell MCers of erasure state are non-aggressor cells and the memory cell MCers of erasure state receives a relatively small interference from the adjacent memory cells.

By contrast, referring to FIG. 7, memory cells adjacent to the memory cell MCers of erasure state maintain a program state P. Thus, all the memory cells adjacent to the memory cell MCers of erasure state are aggressor cells and the memory cell MCers of erasure state is greatly interfered with by the adjacent memory cells.

Since the memory cell MCers of erasure state of FIG. 6 receives small interference by the adjacent memory cells, a change of threshold voltage of the memory cell MCers of erasure state is small. Thus, the need for programming the memory cell MCers of erasure state of FIG. 6 from the first erasure state E1 to the second erasure state E2 is small.

Since the memory cell MCers of erasure state of FIG. 7 receives great interference from the adjacent memory cells, a change of threshold voltage of the memory cell MCers of erasure state is very large. Thus, the need for programming the memory cell MCers of erasure state of FIG. 6 from the first erasure state E1 to the second erasure state E2 is great.

As described with reference to FIGS. 6 and 7, the memory cells MCers of erasure state have different threshold voltage changes according to program states of the adjacent memory cells. Considering this, the nonvolatile memory device 100 performs the second shadow programming operation on only selected memory cell among memory cells of the first erasure state E1 based on the states of the adjacent memory cells.

Figure 8:
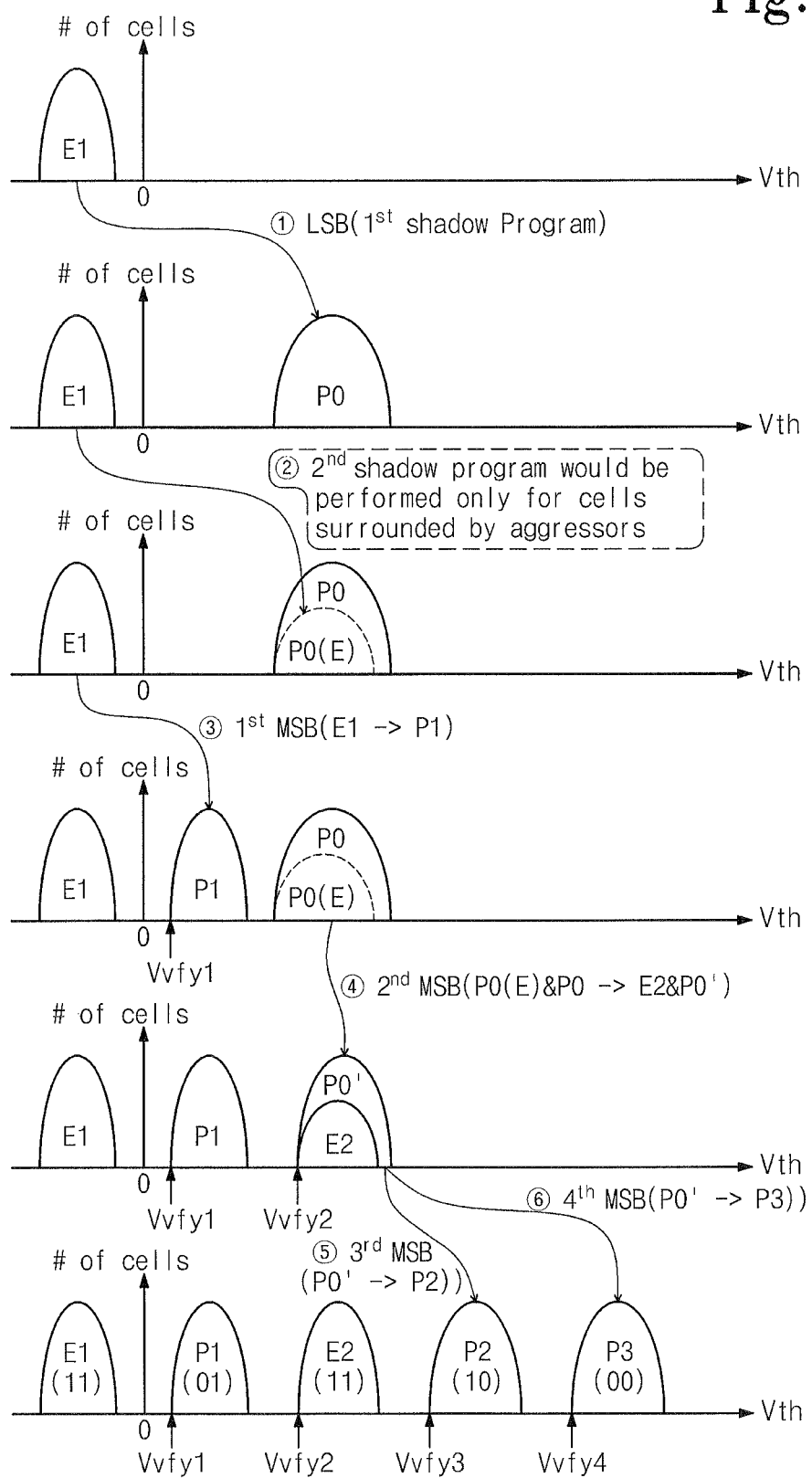
FIG. 8 is a drawing illustrating threshold voltage distributions to describe a method of programming the nonvolatile memory device of FIG. 1 according to an exemplary embodiment of the inventive concept.

FIG. 8 is a drawing illustrating threshold voltage distributions to describe a method of programming the nonvolatile memory device 100 of FIG. 1. The method of programming the nonvolatile memory device 100 which will be described in FIG. 8 is similar to the method of programming described in FIG. 4. Thus, hereinafter, the differences between the two programming methods is described in detail.

Referring to FIG. 8, the nonvolatile memory device 100 performs a programming method whereby each memory cell will have a threshold voltage corresponding to any one of the first through third program states P1, P2 and P3, and the first and second erasure states E1 and E2. Thus, the first erasure state E1 of FIG. 4 is a pseudo erasure state but data of '11' is assigned to the first erasure state E1 of FIG. 8 like the second erasure state E2.

First, the first shadow program step is performed that programs memory cells, among memory cells of the first erasure state E1, to be programmed to the second program state P2 or to be programmed to the third program state P3 to the shadow program state P0.

After that, the second shadow program step is performed that programs memory cells, among memory cells of the first erasure state E1, to be programmed to the second program state P2 to the shadow erasure state P0(E). Herein, the second shadow program step is performed only on selected memory cells among the memory cells of the first erasure state E1. For example, the second shadow program step may be performed only on memory cells to which data '11' of erasure state is given and on memory cells of which any adjacent memory cells is an aggressor cell.

After that, memory cells that belong to the first erasure state E1 are programmed to the first program state P1. Thus, among memory cells that belong to the first erasure state E1, memory cells to which data '01' is given are programmed to the first program state P1. In this case, memory cells to which data '11' is given and of which all or at least one adjacent memory cell is a non-aggressor cell maintain the first erasure state E1.

After that, step is performed that programs memory cells that belong to the shadow program state P0 and the shadow erasure state P0(E) to the prime shadow program state P0' and the second erasure state E2 respectively. A step is performed that programs memory cells that belong to the prime shadow program state P0' to the second program state P2 or to the third program state P3.

Figure 9:
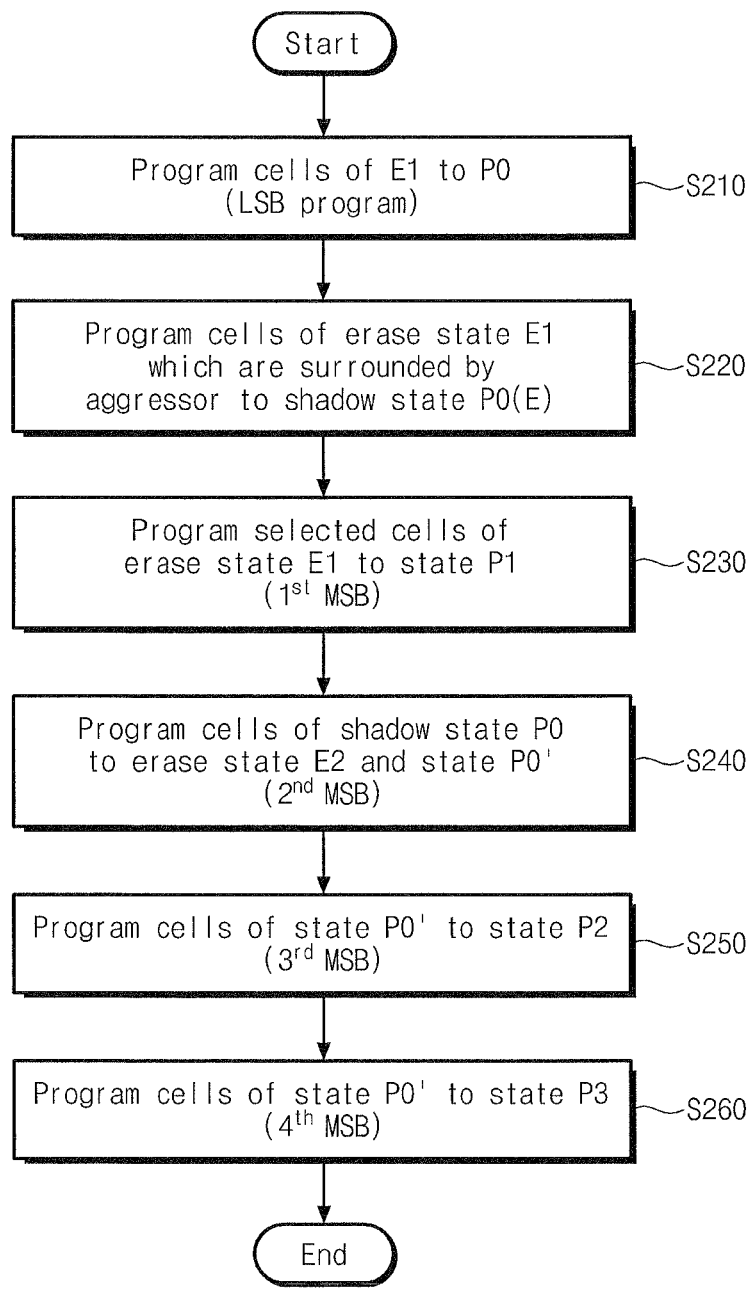
FIG. 9 is a flow chart illustrating the method of programming the nonvolatile memory device described in FIG. 8.

FIG. 9 is a flow chart illustrating the method of programming the nonvolatile memory device 100 described in FIG. 8.

In step S210, the least significant bit (LSB) program step is performed. Thus, among memory cells of the first erasure state E1, memory cells to be programmed to the second and third programs states P2 and P3 are programmed to the shadow program state P0.

In step S220, among memory cells that belong to the first erasure state E1, the selected memory cells are programmed to the shadow erasure state P0(E). In this step, memory cells to which data '11' of erasure state is given and memory cells of which adjacent memory cells are aggressor cells are programmed to the shadow erasure state P0(E).

In step S230, the first MSB program step is performed which, among memory cells that belong to the first erasure state E1, memory cells to which data '01' is given are programmed to the first program state P1.

In step S240, step is performed that programs memory cells that belong to the shadow program state P0 and memory cells that belong to the shadow erasure state P0(E) to the prime shadow program state P0' and the second erasure state E2 respectively.

In step S250, the third MSB program step is performed that programs memory cells that belong to the prime shadow program state to the second program state P2. In step S260, the fourth MSB program step is performed that programs memory cells that belong to the prime shadow program state to the third program state P3.

As described with reference to FIGS. 6 through 9, the nonvolatile memory device 100 may perform the second shadow program step only on memory cells (among memory cells to which data '11' of erasure state is given) of which adjacent memory cells are aggressor cells. In this case, since the second shadow program step is not performed on memory cells (among memory cells to which data '11' of erasure state is given) of which all or at least one adjacent memory cell is a non-aggressor cell, the total time which is taken to perform the program method may be reduced.

The aforementioned description is only as an exemplary illustration and the technical spirit of the inventive concept is not limited thereto. For example, in FIGS. 8 and 9, a program operation is not performed on memory cells (among memory cells to which data '11' of erasure state is given) of which at least one adjacent cell is a non-aggressor cell. This is only as an example illustration. In another exemplary embodiment, memory cells (among memory cells to which data '11' of erasure state is given) of which at least one adjacent cell is a non-aggressor cell may be programmed to have a threshold voltage lower than the first program state P1.

Referring back to FIG. 8, the threshold voltages illustrated in FIG. 8 of the 2-bit multi level cells correspond to any one of five states E1, E2, P1, P2 and P3. The threshold voltage of 2-bit multi level cells as illustrated in FIG. 8 corresponds to any one of five states E1, E2, P1, P2 and P3 while the threshold voltage of conventional 2-bit multi level cell corresponds only to any one of four states E1, P1, P2 and P3. Thus, a read operation of the nonvolatile memory device 100 described in FIGS. 6 through 9 needs a different scheme as compared with a conventionally programmed memory cell.

Figure 10:
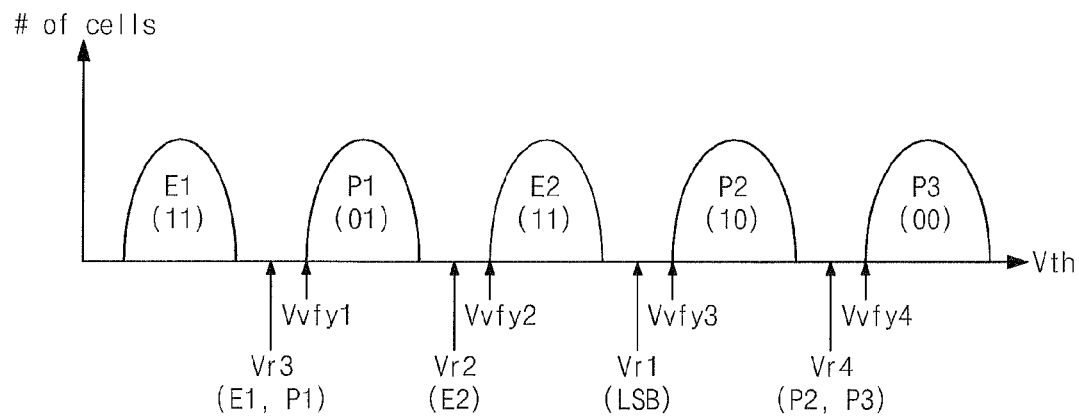
FIG. 10 is a threshold voltage distribution drawing for describing a read operation with respect to memory cells programmed by the programming method described in FIGS. 6 through 9.

FIG. 10 is a threshold voltage distribution drawing for describing a read operation with respect to memory cells programmed by the programming method described in FIGS. 6 through 9. In FIG. 10, the horizontal axis represents the threshold voltage of memory cells and the vertical axis represents the number of memory cells.

Referring to FIG. 10, a read operation is performed by four selected read voltages Vr1~Vr4. Thus, when a read operation is performed, the voltage generator 150 generates four selected read voltages Vr1~Vr4 and the program control logic circuit 140 controls so that the four selected read voltages Vr1~Vr4 are provided to the selected word line.

When a read operation is performed, first, the first selected read voltage Vr1 is provided to the selected word line. In this case, the level of the first selected read voltage Vr1 is higher than the threshold voltage of the second erasure state E2 and is lower than the threshold voltage of the second program state P2. By providing the first read voltage Vr1 to the selected word line, a value indicating whether the least significant bit (LSB) is '0' or '1' is detected.

If a value of the least significant bit (LSB) is detected to be '0', then detecting whether the value of the most significant bit (MSB) is '0' or '1' may be distinguished by providing the fourth selected read voltage Vr4 to the selected word line. In this event, the level of the fourth selected read voltage Vr4 is higher than the threshold voltage of the second program state P2 and is lower than the threshold voltage of the third program state P3.

If the value of the least significant bit (LSB) is detected to be '1', then detecting whether the value of the most significant bit (MSB) is '0' or '1' may be distinguished by providing the second selected read voltage Vr2 to the selected word line. Whether a memory cell belongs to the second erasure state E2 may be detected by providing the second selected read voltage Vr2 to the selected word line. In this case, a level of the second selected read voltage Vr2 is higher than the threshold voltage of the first program state P1 and is lower than the threshold voltage of the second erasure state E2.

When the second selected read voltage Vr2 is provided to the selected word line, it is detected that memory cells being OFF among memory cells connected to the selected word line belong to the second erasure state E2. Conversely, it is detected that memory cells being (turned) ON among memory cells connected to the selected word line belong to any one state of the first erasure state E1 and the first program state P1.

After that, the third selected read voltage Vr3 is provided to the selected word line. Whether a memory cell belongs to the first erasure state E1 or to the first program state P1 may be detected by providing the third selected read voltage Vr3 to the selected word line. In this event, the level of the third selected read voltage Vr3 is higher than the threshold voltage of the first erasure state E1 and is lower than the threshold voltage of the first program state P1.

As described in FIG. 10, in the present embodiment of the inventive concept, the threshold voltage of 2-bit multi level bit corresponds to any one state of five states E1, E2, P1, P2 and P3. Thus, a read operation may be performed by applying the four selected read voltages Vr1~Vr4.

III. A Nonvolatile Memory Device Improving the Threshold Voltage Distribution of the Second Erasure State or the First Program State FIGS. 11 and 12 are drawings showing changes a of threshold voltage corresponding to a first program state in accordance with the most significant bit data (MSB) program step of adjacent cells.

Figure 11:
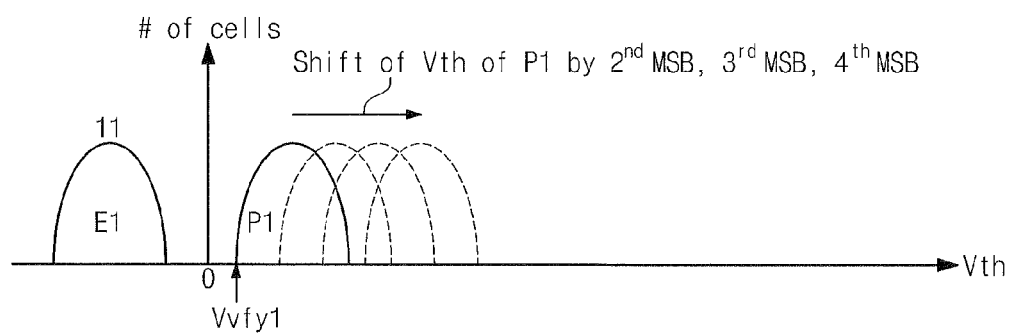
FIGS. 11 and 12 are drawings showing a change of threshold voltage corresponding to a first program state due to programming the most significant bit data.
Figure 12:
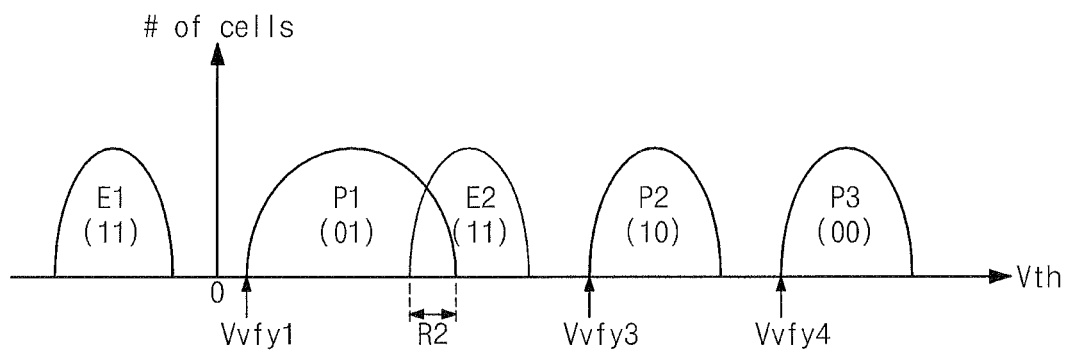

Referring to FIG. 11, the threshold voltage corresponding to the first program state P1 is shifted by second, third and fourth MSB programs (of adjacent cells). Referring to FIG. 8, after a first MSB program step is performed, the second, third and fourth MSB programs are sequentially performed. Thus, the level of threshold voltage of memory cells that belong to the first program state P1 may be increased by a coupling phenomenon with adjacent cells or a program disturb phenomenon. Thus, as illustrated in FIG. 11, the threshold voltage of the first program state P1 may increase. In this case, referring to FIG. 12, a read fail may occur with respect to memory cells that fall into a second area R2.

An aspect of the invention provides a nonvolatile memory device 100 that uses a scheme improving the distribution of the second erasure state E2 or of the first program state P1 when performing a program operation.

Figure 13:
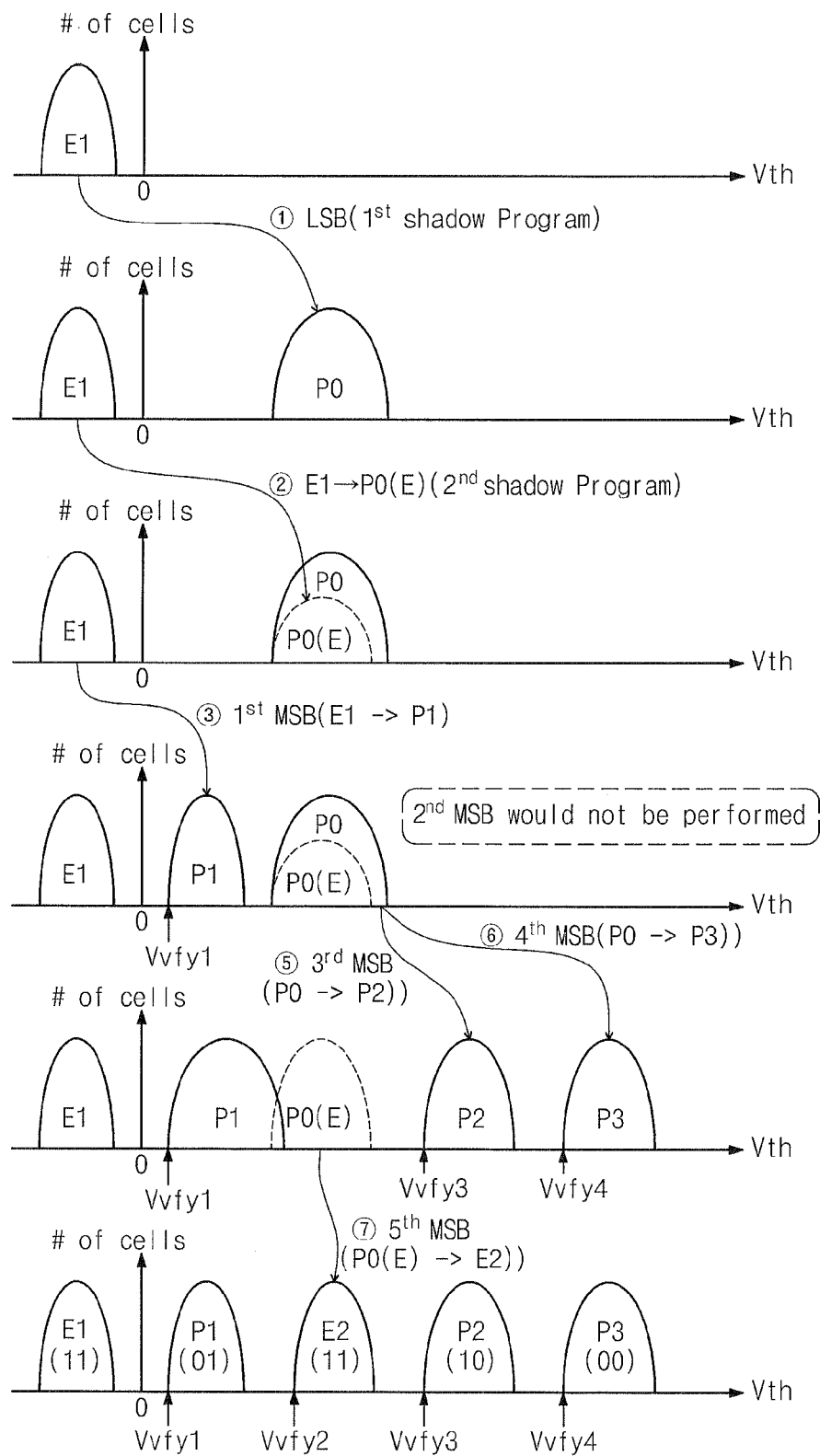
FIG. 13 is a drawing illustrating threshold voltage distributions to describe a method of programming the nonvolatile memory device of FIG. 1 according to another exemplary embodiment.

FIG. 13 is a drawing illustrating threshold voltage distributions to describe a method of programming the nonvolatile memory device of FIG. 1 according to another exemplary embodiment. The programming method of the nonvolatile memory device 100 which will be described in FIG. 13 is similar to the program method described in FIG. 8. Thus, hereinafter, the differences between the program methods is described in detail.

The programming method of FIG. 13 does not perform the second MSB program step as compared with the programming method of FIG. 8. Also, the programming method of FIG. 13 further performs a fifth MSB program step as compared with the program method of FIG. 8.

The first shadow program step is performed, among memory cells of the first erasure state E1, that programs to the shadow program state P0 those memory cells to be programmed to the second program state P2 or to the third program state P3. After that, the second shadow program step is performed that programs memory cells (among memory cells of the first erasure state E1) to the shadow erasure state P0(E) those to be programmed to the second erasure state E2.

Memory cells that belong to the first erasure state E1 are programmed to the first program state P1.

Unlike the program method of FIG. 8, the programming method of FIG. 13 does not perform step of programming memory cells that belong to the shadow program state P0 and the shadow erasure state P0(E) to the prime shadow program state P0' and the second erasure state E2 respectively. Thus, after memory cells that belong to the first erasure state E1 are programmed to the first program state P1, step is performed that programs memory cells that belong to the shadow program state P0 to the second program state P2 or the third program state P3.

Unlike the programming method of FIG. 8, the programming method of FIG. 13 further includes the fifth MSB programming step after performing the fourth MSB program step. Herein, the fifth MSB program step means step of programming memory cells that belong to the shadow erasure state P0(E) to the second erasure state E2. Finally, by performing the fifth MSB program step narrowing a distribution of the second erasure state E2, the second erasure state E2 of FIG. 13 may have a narrow threshold voltage distribution as compared with the threshold voltage distribution of the second erasure state E2 of FIG. 8.

Figure 14:
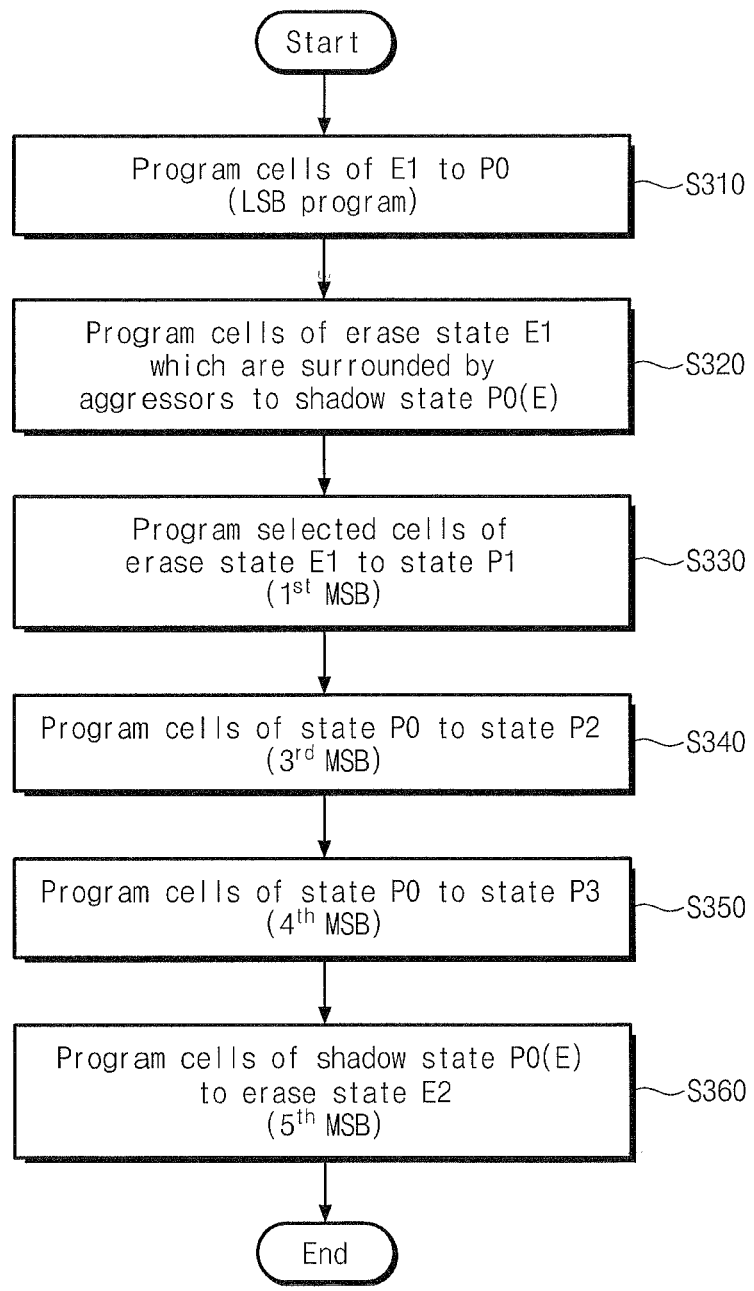
FIG. 14 is a flow chart of the programming method of FIG. 13.

FIG. 14 is a flow chart of the programming method of FIG. 13.

In step S310, the least significant bit (LSB) program step is performed. Thus, among memory cells of the first erasure state E1, memory cells to be programmed to the second and third program states P2 and P3 are programmed to the shadow program state P0.

In step S320, among memory cells of the first erasure state E1, the selected memory cells are programmed to the shadow erasure state P0(E). In this case, memory cells to which data '11' is given and of which adjacent cells are aggressor cells are programmed to the shadow erasure state P0(E).

In step S330, the first MSB program step is performed, among memory cells of the first erasure state E1, that programs memory cells to which data '01' is given to the first program state P1.

In step S340, the third MSB program step is performed that programs memory cells that belong to the shadow program state P0 to the second program state P2 and in step S350, the fourth MSB program step is performed that programs memory cells that belong to the shadow program state P0 to the third program state P3.

After that, in step S360, the fifth MSB program step is performed that programs memory cells that belong to the shadow erasure state P0(E) to the second erasure state E2.

Figure 15:
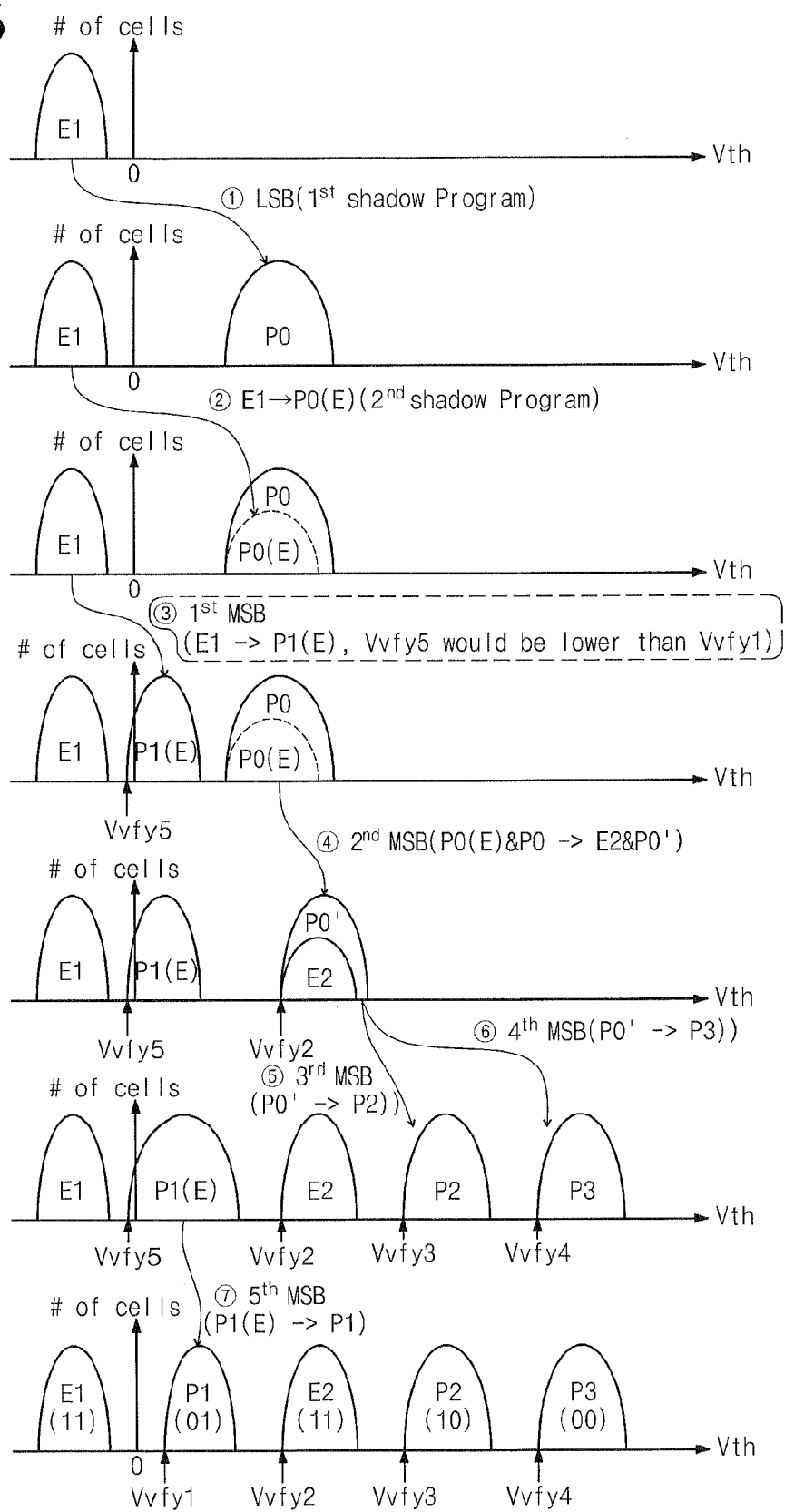
FIG. 15 is a drawing illustrating threshold voltage distributions to describe a method of programming the nonvolatile memory device of FIG. 1 according to another exemplary embodiment.

FIG. 15 is a drawing illustrating threshold voltage distributions to describe a method of programming the nonvolatile memory device 100 of FIG. 1 according to another embodiment. The programming method of the nonvolatile memory device 100 which is described in FIG. 15 is similar to the programming method described in FIG. 8. Thus, hereinafter, the differences between the programming methods is described in detail.

The programming method of FIG. 15 sets a verification voltage Vvfy5 to be low when performing the first MSB program step as compared with the programming method of FIG. 8. Also, the programming method of FIG. 15 further performs the fifth MSB program step of programming memory cells of the first shadow program state P1(E) to the first program state P1.

First, the first shadow program step is performed, among memory cells of the first erasure state E1, that programs memory cells to be programmed to the second program state P2 or the third program state P3 to the shadow program state P0. After that, the second shadow program step is performed, among memory cells of the first erasure state E1, that programs memory cells to be programmed to the second erasure state E2 or to the shadow erasure state P0(E).

Memory cells that belong to the first erasure state E1 are programmed to the first shadow program state P1(E). Herein, unlike in the program method of FIG. 8, the level of the verification voltage Vvfy5 corresponding to the first shadow program state P1(E) is set to be lower than the level of the verification voltage Vvfy1 corresponding to the first program state P1.

Memory cells that belong to the shadow program state P0 and the shadow erasure state P0(E) are programmed to the prime shadow program state P0' and to the second erasure state E2 respectively. After that, step is performed that programs memory cells that belong to the shadow program state P0 to the second programs state P2 or the third program state P3.

Unlike the programming method of FIG. 8, the programming method of FIG. 15 further performs the fifth MSB program step of programming memory cells that belong to the first shadow program state P1(E) to the first program state P1. Finally, by performing the fifth MSB program step of narrowing the threshold voltage distribution of the first program state P1, the first program state E2 of FIG. 15 may have a narrower distribution as compared with the first program state P1 of FIG. 8.

Figure 16:
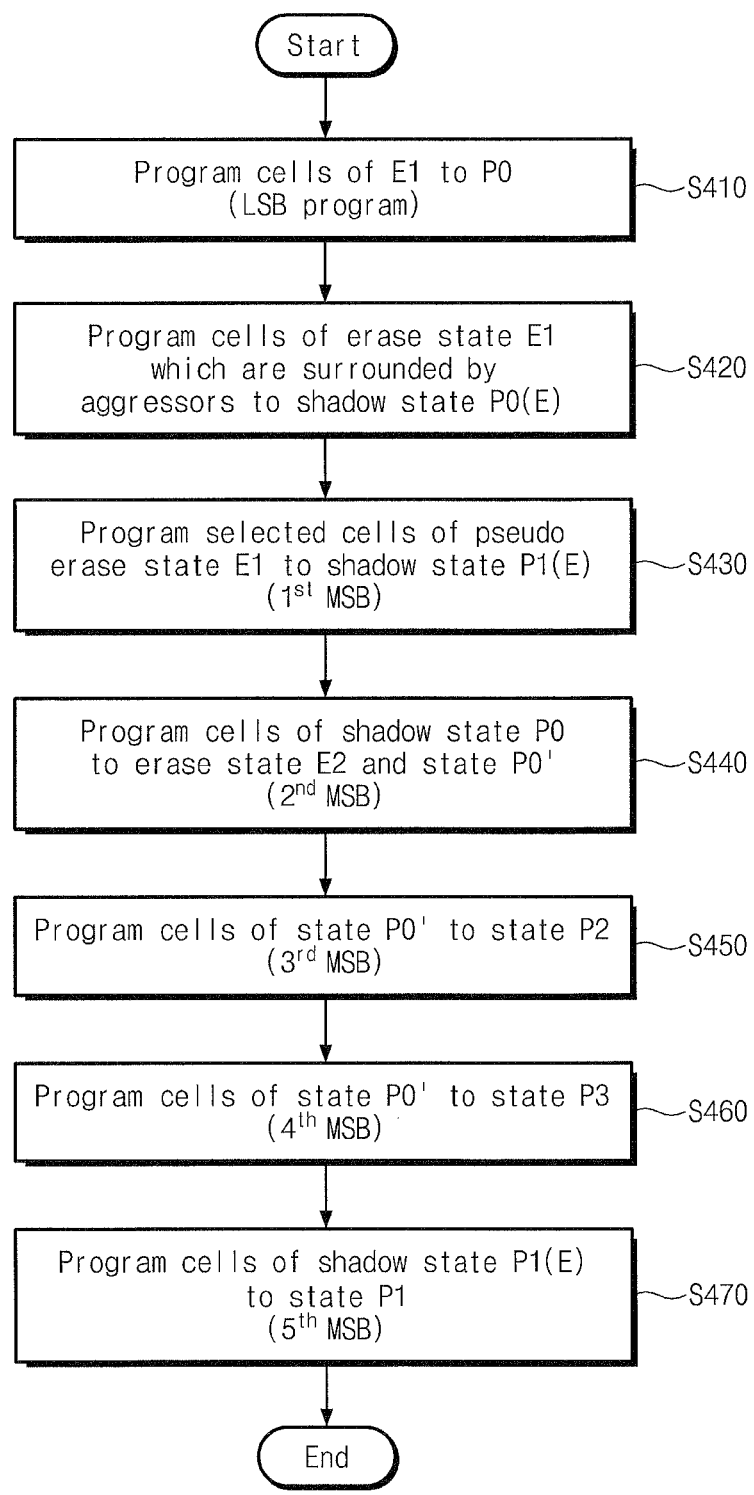
FIG. 16 is a flow chart of the method described in FIG. 15 of programming the nonvolatile memory device of FIG. 1.

FIG. 16 is a flow chart of the method of programming the nonvolatile memory device 100 described in FIG. 15.

In step S410, the least significant bit (LSB) program step is performed. Thus, among memory cells of the first erasure state E1, memory cells to be programmed to the second and third program states P2 and P3 are programmed to the shadow program state P0. In step S420, the selected memory cells among memory cells that belong to the first erasure state E1 are programmed to the shadow erasure state P0(E).

In step S430, the first MSB program step is performed which among memory cells that belong to the first erasure state E1, programs memory cells to which data '01' is given to the first shadow program state P1(E). In this case, the verification voltage corresponding to the first shadow program state P1(E) is set to be lower than the verification voltage corresponding to the first program state P1.

In step S440, step is performed that programs memory cells that belong to the shadow program state P0 and memory cell that belong to the shadow erasure state P0(E) to the prime shadow program state P0' and the second erasure state E2 respectively.

In step S450, the third MSB program step is performed that programs memory cells that belong to the prime shadow program state P0' to the second program state P2. In step S460, the fourth MSB program step is performed that programs memory cells that belong to the prime shadow program state P0' to the third program state P3. After that, in step S470, the fifth MSB program step is performed that programs memory cells that belong to the first shadow program state P1(E) to the first program state P1.

Figure 17:
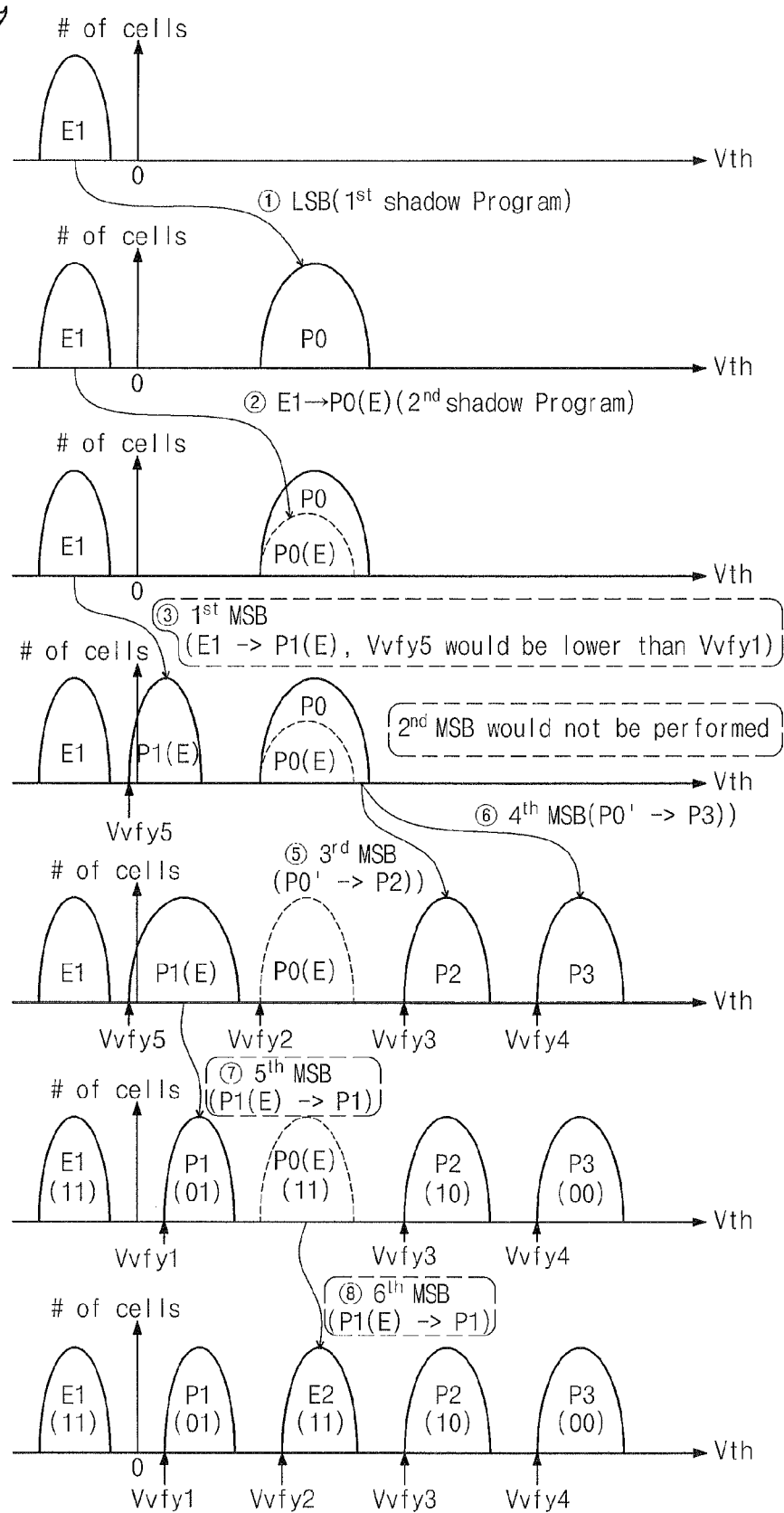
FIG. 17 is a drawing illustrating threshold voltage distributions to describe a method of programming the nonvolatile memory device of FIG. 1 according to another exemplary embodiment.

FIG. 17 is a drawing illustrating threshold voltage distributions to describe a method of programming the nonvolatile memory device 100 of FIG. 1 according to another exemplary embodiment. The method of programming the nonvolatile memory device 100 which will be described in FIG. 17 is similar to the programming method described in FIG. 8. Thus, hereinafter, the differences between the methods of programming is described in detail.

The programming method of FIG. 17 does not perform the second MSB program step as compared with the programming method of FIG. 8. Also, the programming method of FIG. 17 further performs a fifth MSB program step that programs memory cells of the first shadow program state P1(E) to the first program state P1 and a six MSB program step that programs memory cells of the shadow erasure state P0(E) to the second erasure state E2 as compared with the programming method of FIG. 8.

Finally, by performing the fifth MSB program step narrowing the threshold voltage distribution of the first program state P1 and the six MSB program step narrowing the threshold voltage distribution of the second erasure state E2, the first program state P1 and the second erasure state E2 of FIG. 17 may have a narrow threshold voltage distribution as compared with the first program state P1 and the second erasure state E2 of FIG. 8.

Figure 18:
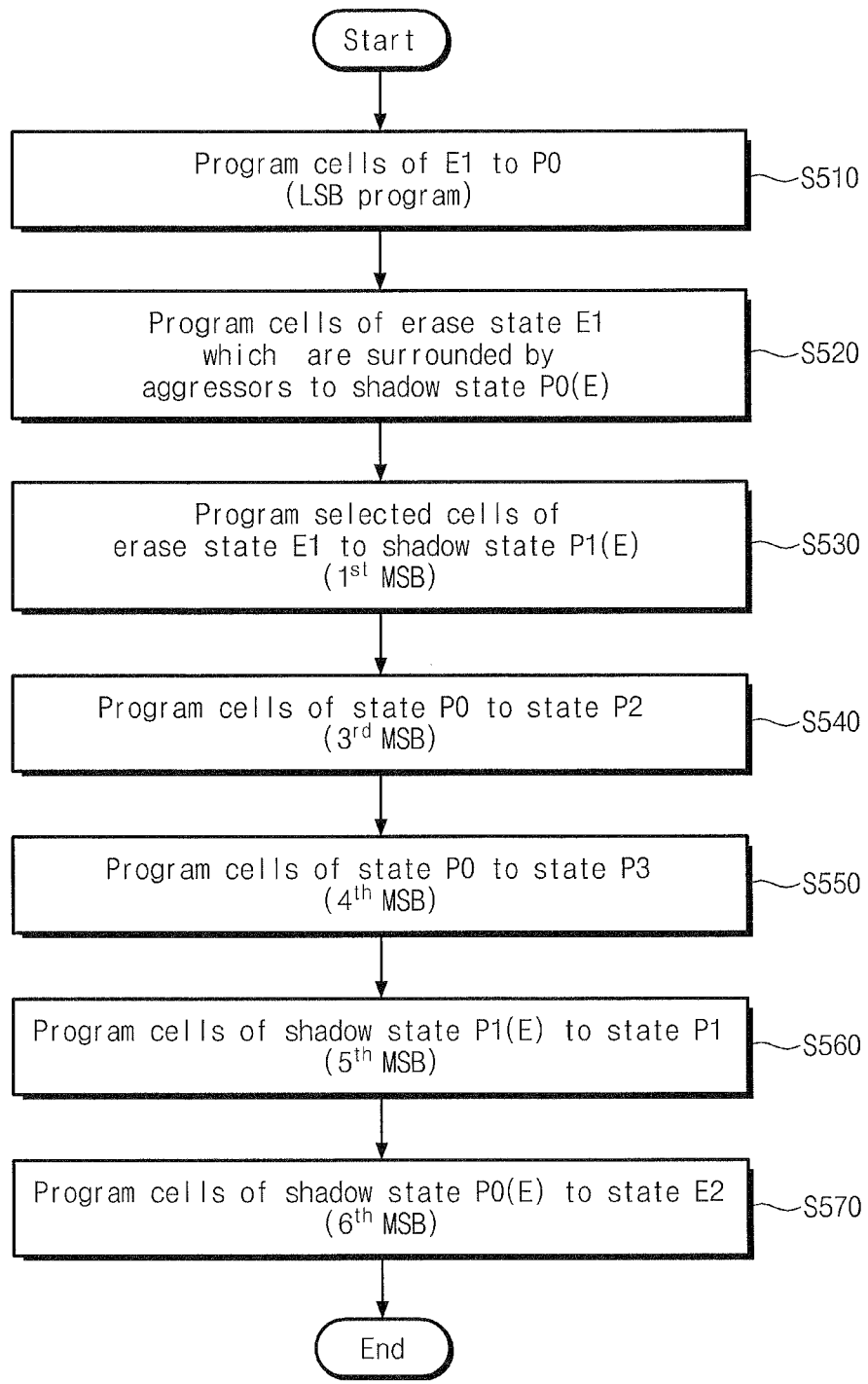
FIG. 18 is a flow chart of the programming method described in FIG. 17.

FIG. 18 is a flow chart the programming method described in FIG. 17.

In step S510, the least significant bit (LSB) program step is performed. Thus, among memory cells of the first erasure state E1, memory cells to be programmed to the second and third program states P2 and P3 are programmed to the shadow program state P0. In step S520, the selected memory cells among memory cells that belong to the first erasure state E1 are programmed to the shadow erasure state P0(E).

In step S530, the first MSB program step is performed, among memory cells that belong to the first erasure state E1, that programs memory cells to which data '01' is given to the first shadow program state P1(E).

In step S540, the third MSB program step is performed that programs memory cells that belong to the shadow program state P0 to the second program state P2. In step S550, the fourth MSB program step is performed that programs memory cells that belong to the shadow program state P0 to the third program state P3.

In step S560, the fifth MSB program step is performed that programs memory cells that belong to the first shadow program state P1(E) to the first program state P1. In step S570, the sixth MSB program step is performed that programs memory cells that belong to the shadow program state P0(E) to the second erasure state E2.

VI. Application Example

FIGS. 19 through 22 are drawings illustrating threshold voltage distributions to describe various application examples of the technical spirit of the inventive concept.

Figure 19:
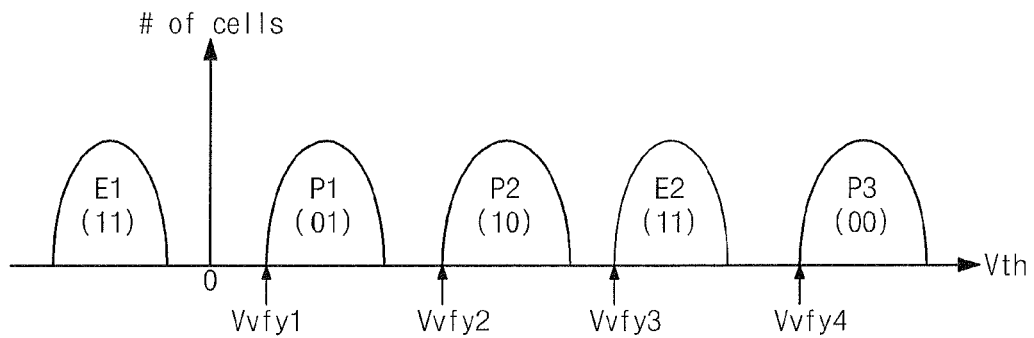
FIGS. 19 through 22 are drawings illustrating various application examples of the technical spirit of the inventive concept.
Figure 20:
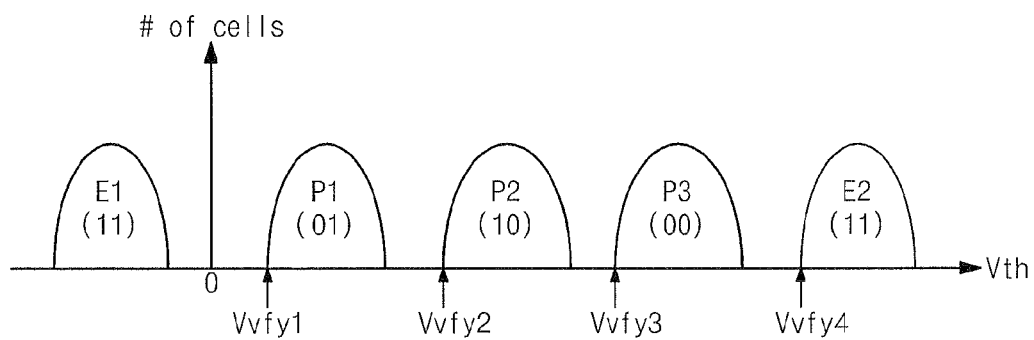

In FIGS. 1 through 18, the threshold voltage of the second erasure state E2 is higher than the threshold voltage of the first program state P1 and is lower than the threshold voltage of the second program state P2. Alternatively as illustrated in FIG. 19, the threshold voltage of the second erasure state E2 may be higher than the threshold voltage of the second program state P2 and may be lower than the threshold voltage of the third program state P3. Also, alternatively as illustrated in FIG. 20, the threshold voltage of the second erasure state E2 may be higher than the threshold voltage of the third program state P3.

Figure 21:
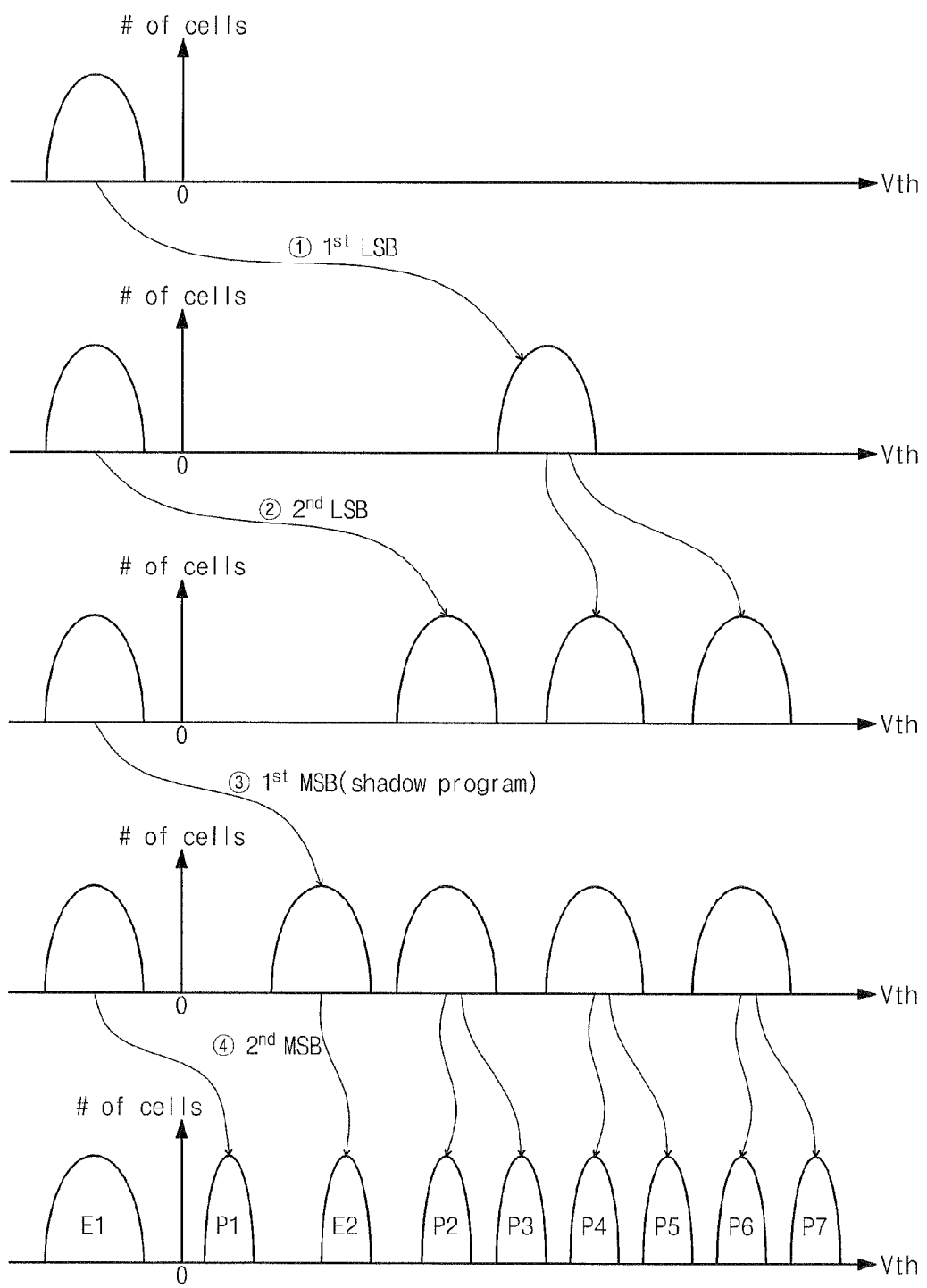
Figure 22:
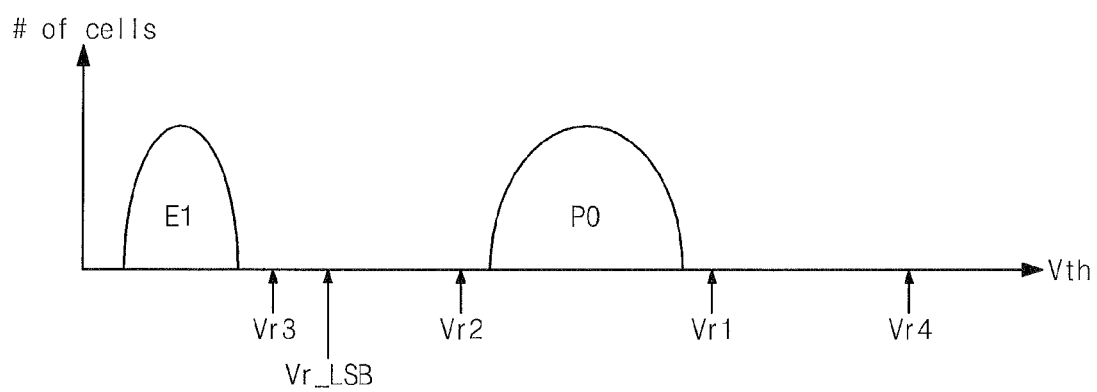

In FIGS. 1 through 18, a method of programming a 2-bit multi level cell is described. Alternatively as illustrated in FIG. 20, the technical spirit of the inventive concept may be applied to a 3-bit multi level cell and may be applied to a 3 or more bits multi level cell. In this case, as illustrated in FIG. 21, the threshold voltage of the second erasure state E2 may be higher than the threshold voltage of the first program state P1 and may be lower than the threshold voltage of the second program state P2.

Also, a memory cell of the memory cell array 110 may be used as a single bit cell SLC. In this case, the programming method is essentially the least significant bit (LSB) program step and has a distribution of threshold voltage like shown in FIG. 22. In this case, if a read operation is performed, the level of the selected read voltage Vr_LSB is set to be higher than the level of the third selected read voltage Vrd3 and to be lower than the level of the second read voltage Vr2.

V. Application Examples

Figure 23:
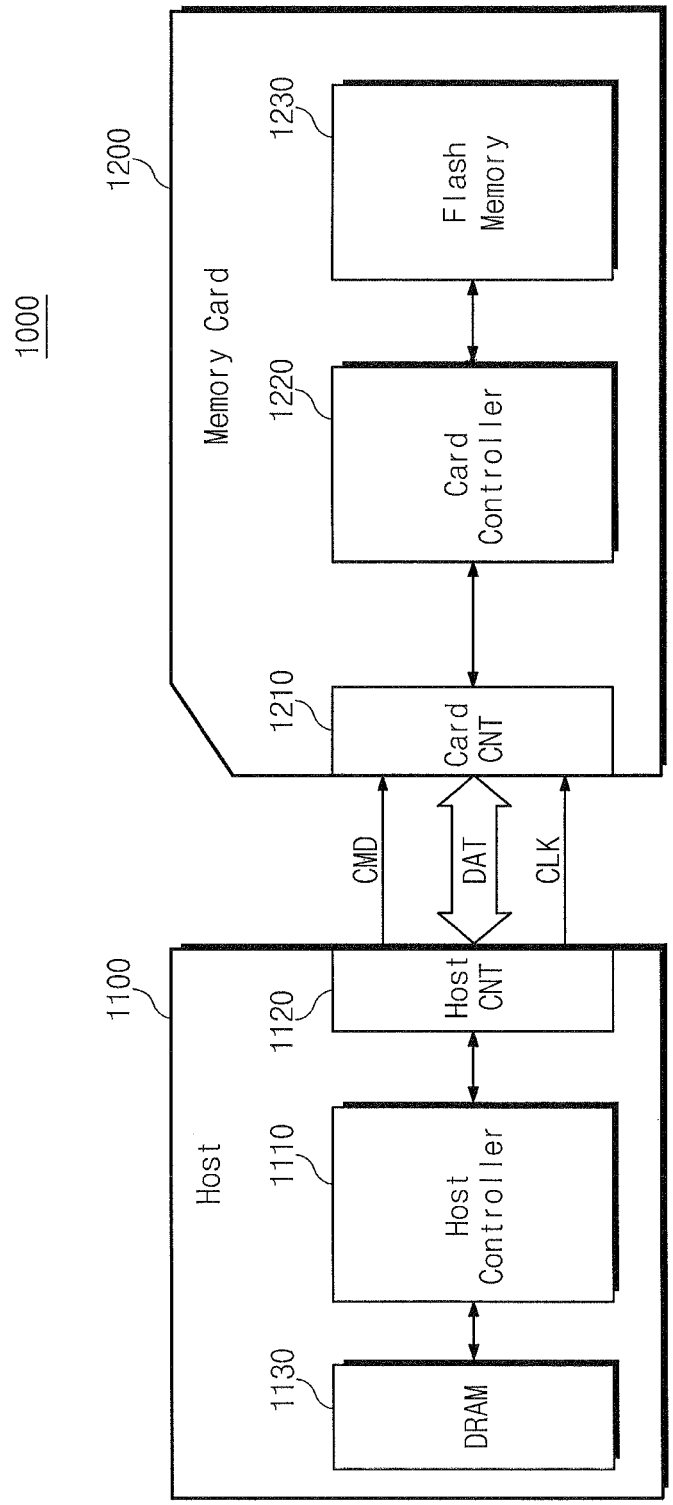
FIG. 23 is a block diagram of an exemplary embodiment in which a nonvolatile memory device in accordance with some embodiments of the inventive concept is applied to a memory card system.

FIG. 23 is a block diagram of an exemplary embodiment in which a nonvolatile memory device in accordance with some embodiments of the inventive concept is applied to a memory card system. A memory card system 1000 includes a host 1100 and a memory card 1200. The host 1100 includes a host controller 1110, a host connection unit 1120 and a DRAM 1130.

The host 1100 writes data in the memory card 1200 or reads data stored in the memory card 1200. The host controller 1110 transmits a command (e.g., a write command), a clock signal CLK generated from a clock generator (not shown) in the host 1100 and data DATA to the memory card 1200 through the host connection unit 1120. The DRAM 1130 is the main memory of the host 1100.

The memory card 1200 includes a card connection unit 1210, a card controller 1220, and a flash memory 1230. The card controller 1220, in response to a command received through the card connection unit 1210, stores data in the flash memory 1230 in synchronization with a clock signal CLK generated from a clock generator (not shown) in the card controller 1220. The flash memory 1230 stores data transmitted from the host 1100. In the case that the host 1100 is a digital camera, the flash memory 1230 stores digital image data.

The memory card system illustrated in FIG. 23 may include the host controller 1110, the card controller 1220 or a compressed data manage logic (not shown) and a compressor (not shown) in the flash memory 1230. As described above, an aspect of the inventive concept provides a method that programs memory cells of erasures state so that the threshold voltage of the erasure state is set to be higher than the threshold voltage of program state. Thus, a read failure caused by an increase of threshold voltage of memory cells of erasure state may be prevented.

Figure 24:
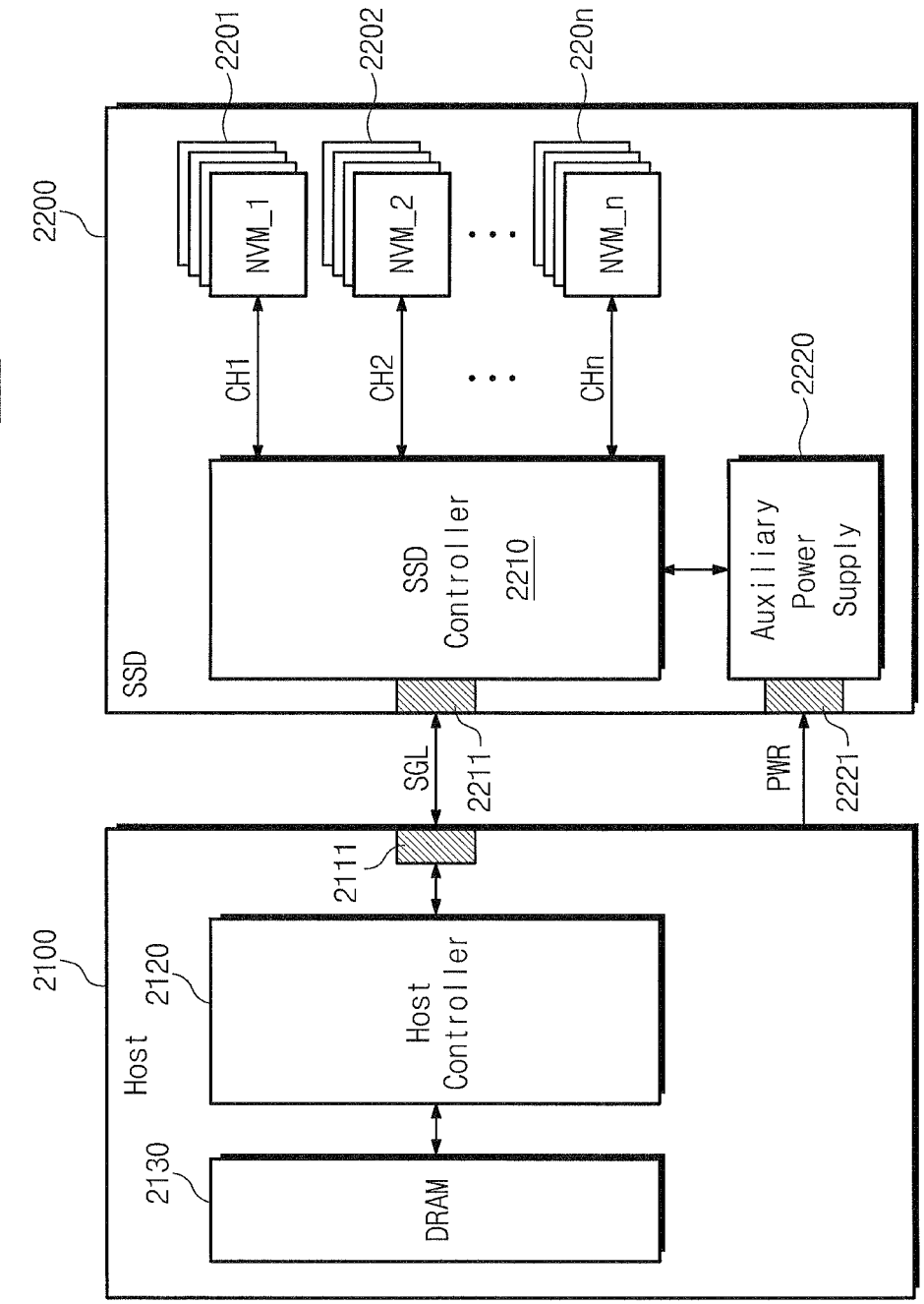
FIG. 24 is a block diagram of an exemplary embodiment in which a nonvolatile memory device in accordance with some embodiments of the inventive concept is applied to solid state drive (SSD) system.

FIG. 24 is a block diagram of an exemplary embodiment in which a nonvolatile memory device in accordance with some embodiments of the inventive concept is applied to solid state drive (SSD) system. Referring to FIG. 24, the SSD system 2000 includes a host 2100 and a SSD 2200. The host 2100 includes a host interface 2111, a host controller 2120 and a DRAM 2130.

The host 2100 writes data in the SSD 2200 or reads data stored in the SSD 2200. The host controller 2120 transmits signals such as a command, an address, a control signal, etc. to the SSD 2200 through the host interface 2111. The DRAM 2130 is a main memory of the host 2100.

The SSD 2200 exchanges a signal SGL with the host 2100 through the host interface 2211. The SSD 2200 may include a plurality of nonvolatile memories 2201~220n, a SSD controller 2210 and an auxiliary power supply 2220. The plurality of nonvolatile memories 2201~220n may be embodied by PRAM, MRAM, ReRAM and FRAM besides a NAND flash memory.

The plurality of nonvolatile memories 2201~220n may be used as a mass storage medium of the SSD 2200. The plurality of nonvolatile memories 2201~220n may be coupled to the SSD controller 2210 through a plurality of channels CH1~CHn. One or more of the nonvolatile memories may be connected to one channel. Nonvolatile memories connected to one channel may be connected to the same data bus.

The SSD controller 2210 exchanges the signal SGL with the host 2100 through the host interface 2211. The signal SGL may include a command, an address, data, etc. The SSD controller 2210 writes data in the corresponding nonvolatile memory or reads data from the corresponding nonvolatile memory according to a command of the host 2100. The internal construction of the SSD controller 2210 is described with reference to FIG. 25 in detail.

The auxiliary power supply 2220 is coupled to the host 2100 through a power connector 2221. The auxiliary power supply 2220 may receive a power PWR from the host 2100 to be charged. The auxiliary power supply 2220 may be located inside the SSD 2200 or outside the SSD 2200. For example, the auxiliary power supply 2220 may be located at a main board and may provide an auxiliary power to the SSD 2200.

Figure 25:
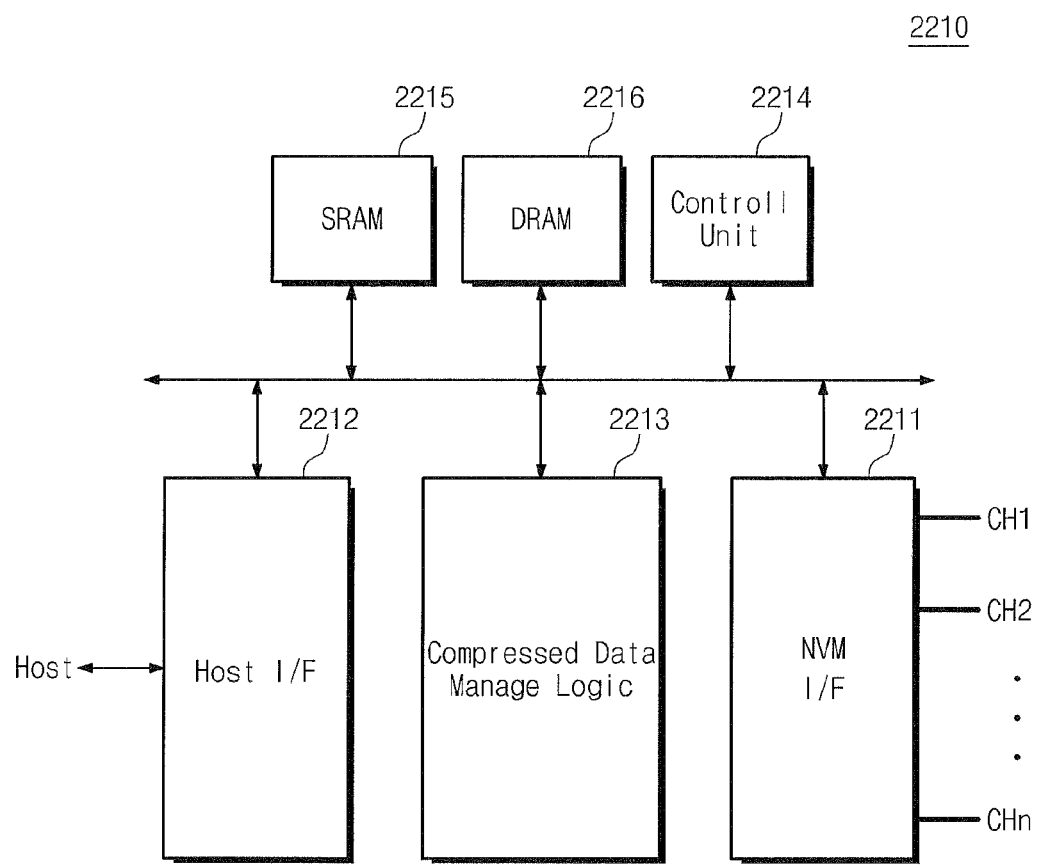
FIG. 25 is a block diagram illustrating internal construction of the SSD controller of FIG. 24.

FIG. 25 is a block diagram illustrating internal construction of the SSD controller 2210 of FIG. 24. Referring to FIG. 25, the SSD controller 2210 includes a NVM interface 2211, the host interface 2212, a compressed data manage logic 2213, a control unit 2214, a SRAM 2215 and a DRAM 2216.

The NVM interface 2211 scatters data received from the main memory of the host 2100 to each of the channels CH1~CHn. The NVM interface 2211 transmits data read from the nonvolatile memories 2201~220n to the host 2100 through the host interface 2212.

The host interface 2212 provides an interface with the SSD 2200 in response to a protocol of the host 2100. The host interface 2212 can communicate with the host 2100 using a universal serial bus (USB), a small computer system interface (SCSI), a PCI express, an ATA, a parallel ATA, a serial ATA, a serial attached SCSI, etc. The host interface 2212 may perform a disk emulation function so that the host 2100 recognizes the SSD 2200 as a hard disk drive HDD.

The compressed data management logic 2213 manages data stored in the nonvolatile memories 2201~220n and supports a gather write operation of compressed data. The control unit 2214 analyzes and processes a signal SGL received from the host 2100. The control unit 2214 controls the host 2100 or the nonvolatile memories 2201~220n through the host interface 2212 or the NVM interface 2211. The control unit 2214 controls operations of the nonvolatile memories 2201~220n according to a firmware for driving the SSD 2200.

The SRAM 2215 may be used to store a software used to effectively manage the nonvolatile memories 2201~220n. The SRAM 2215 may store meta data received from a main memory of the host 2100 or may store cache data. When sudden power off operation is performed, meta data or cache data stored in the SRAM 2215 may be stored in the nonvolatile memories 2201~220n using the auxiliary power supply 2220.

The DRAM 2216 temporarily stores suppressed data and provides a space for collecting suppressed data. Some of the space of the DRAM 2216 may be set to be a waiting region.

Referring back to FIG. 24, the SSD system 200 programs memory cells of an erasure state so that the threshold voltage of the erasure state is set to be higher than the threshold voltage of a program state. Thus, a read failure caused by an increase of threshold voltage of memory cells of erasure state may be prevented.

Figure 26:
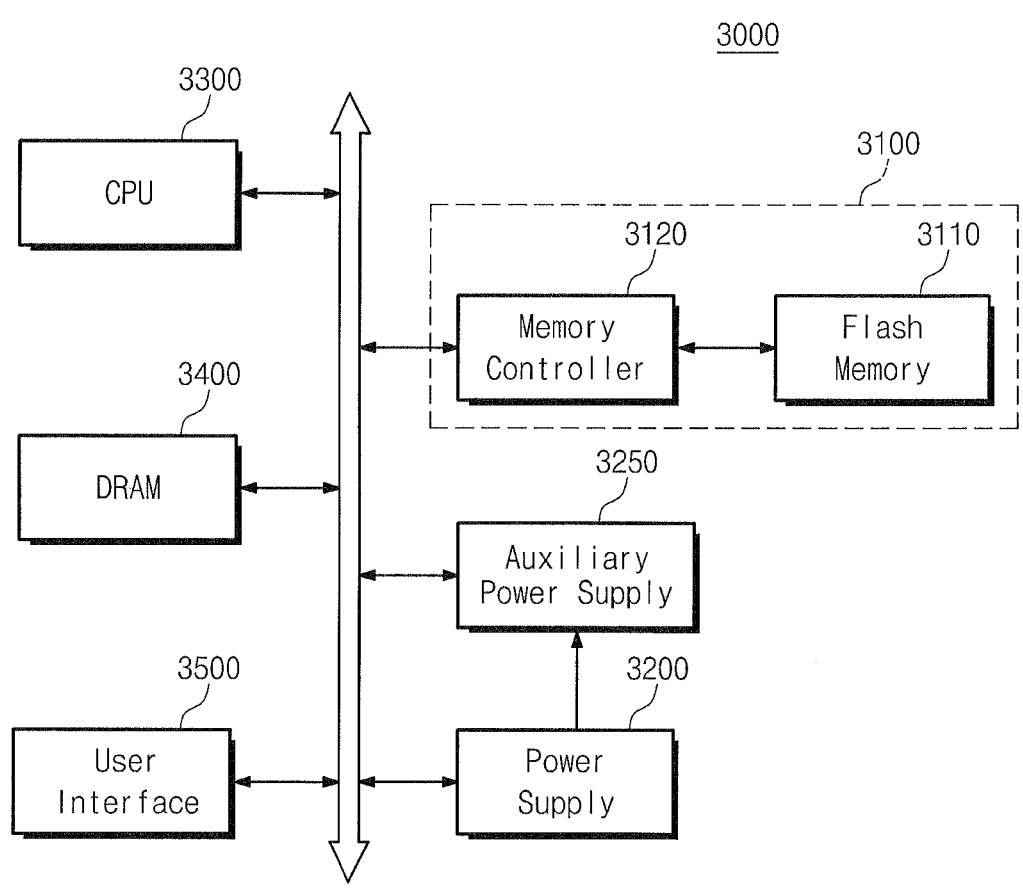
FIG. 26 is a block diagram of exemplary embodiment in which a nonvolatile memory device in accordance with some embodiments of the inventive concept is embodied with an electronic device.

FIG. 26 is a block diagram of an exemplary embodiment in which a nonvolatile memory device in accordance with some embodiments of the inventive concept is embodied with an electronic device. The electronic device 3000 may be implemented as a personal computer PC or may be implemented as a portable electronic device such as a notebook computer, a cell phone, a personal digital assistant (PDA) and a camera.

Referring to FIG. 26, the electronic device 3000 includes a memory system 3100, a power supply 3200, an auxiliary power supply 3250, a central processing unit (CPU) 3300, a DRAM 3400 and a user interface 3500. The memory system 3100 may be built in the electronic device 3000.

As described above, the electronic device 3000 programs memory cells of erasure state so that the threshold voltage of the erasure state is set to be higher than the threshold voltage of program state. Thus, a read failure caused by an increase of threshold voltage of memory cells of erasure state may be prevented.

The memory system in accordance with some embodiments of the inventive concept may be applied to not only a flash memory having a two-dimensional structure but also a flash memory having a three-dimensional structure.

Figure 27:
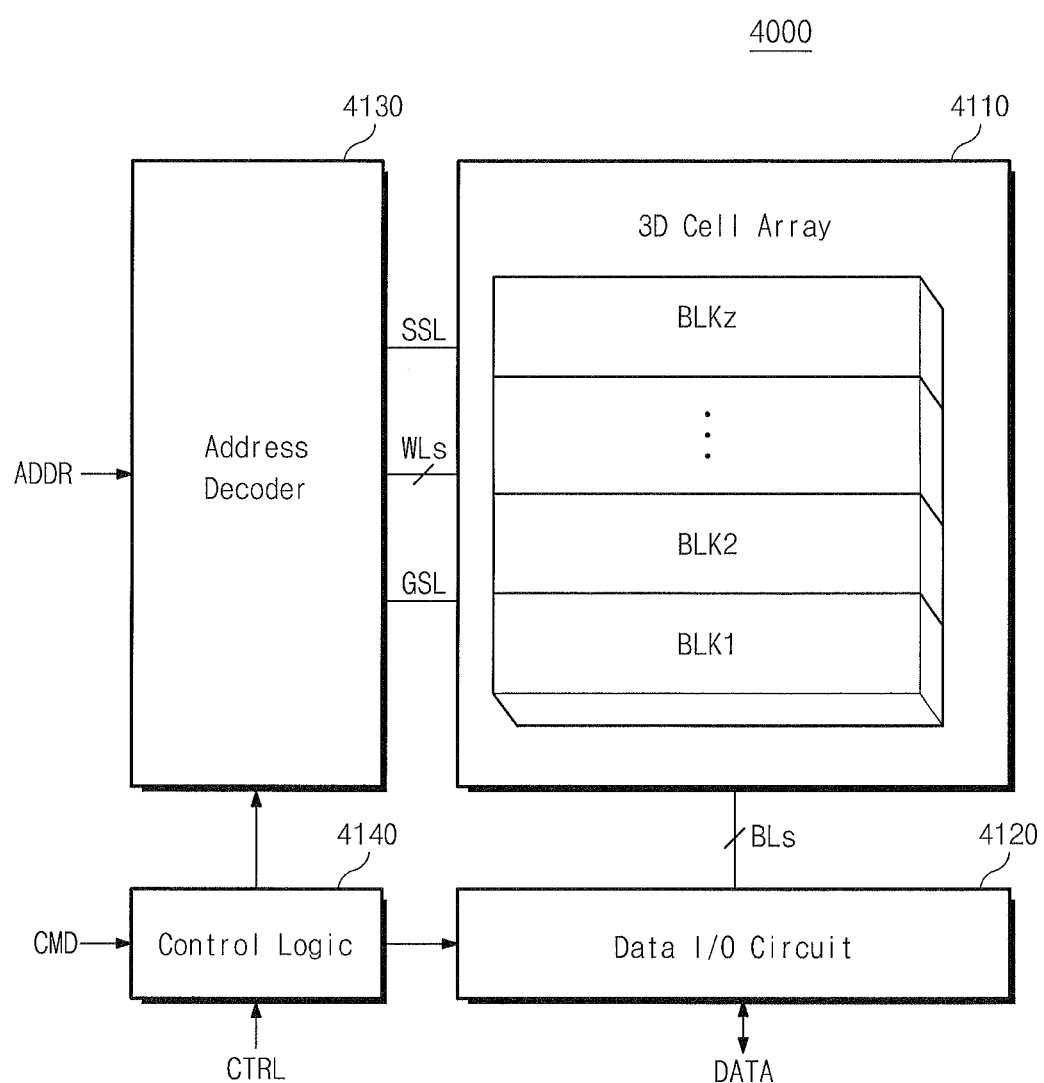
FIG. 27 is a block diagram of a flash memory employing a method of the present inventive concept.

FIG. 27 is a block diagram of a flash memory employing a method in the present inventive concept. Referring to FIG. 27, a flash memory 4000 includes a three-dimensional cell array 4110, a data input/output circuit 4120, an address decoder 4130 and a control logic 4140.

The three-dimensional cell array 4110 includes a plurality of memory blocks BLK1~BLKz. Each memory block may have a three-dimensional structure (or a vertical structure). In a memory block having a two-dimensional structure (or a horizontal structure), memory cells are formed in a direction parallel to the substrate. In a memory block having a three-dimensional structure, memory cells are formed in a direction perpendicular to the substrate. Each memory block constitutes an erasure unit of flash memory.

The data input/output circuit 4120 is coupled to the three-dimensional cell array 4110 through a plurality of bit lines BLs. The data input/output circuit 4120 receives data DATA from the outside or outputs data DATA read from the three-dimensional cell array 4110 to the outside. The address decoder 4130 is coupled to the three-dimensional cell array 4110 through a plurality of word lines WLs and selection lines GSL and SSL. The address decoder 4130 receives an address ADDR and selects a word line.

The control logic 4140 controls program, read and erasure operations of the flash memory 4000. The control logic 4140, when performing a program operation, makes a program voltage be provided to the selected word line by controlling the address decoder 4130 and makes data be programmed by the data input/output circuit 4120.

Figure 28:
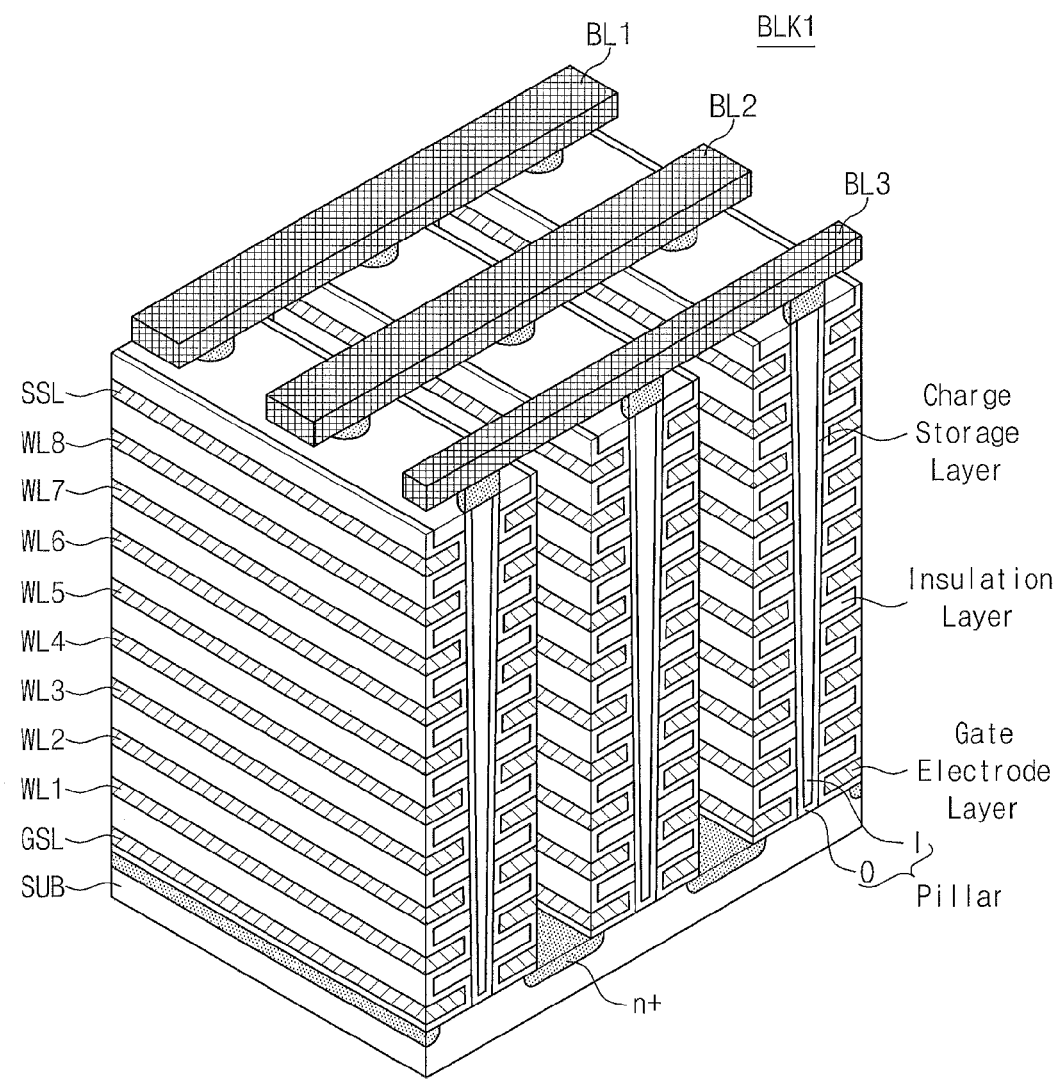
FIG. 28 is a perspective view illustrating the three-dimensional structure of the memory block (BLK1) illustrated in FIG. 27.

FIG. 28 is a perspective view of a three-dimensional structure of the memory block (BLK1) illustrated in FIG. 27. Referring to FIG. 28, the memory block BLK1 is formed in a direction perpendicular to a substrate SUB. An n+ doping region is formed in the substrate SUB. A gate electrode layer and an insulating layer are alternately stacked on the substrate SUB. A charge storage layer may be formed between the gate electrode layer and the insulating layer.

If patterning the gate electrode layer and the insulating layer in a vertical direction, a pillar of text character "V" shape is formed. The pillar passes through the gate electrode layer and the insulating layer to be connected to the substrate SUB. An external part (O) of the pillar may be formed of channel semiconductor and an internal part (I) of the pillar may be formed of insulating material such as a silicon oxide.

Referring to FIG. 28, the gate electrode layer of the memory block BLK1 is connected to a ground select line GSL, a plurality of word lines WL1~WL8 and a string select line SSL. The pillar of the memory block BLK1 may be connected to a plurality of bit lines BL1~BL3. In FIG. 28, one memory block BLK1 is illustrated to have two select lines GSL and SSL, eight word lines WL1~WL8 and three bit lines BL1~BL3 but it is not limited thereto.

Figure 29:
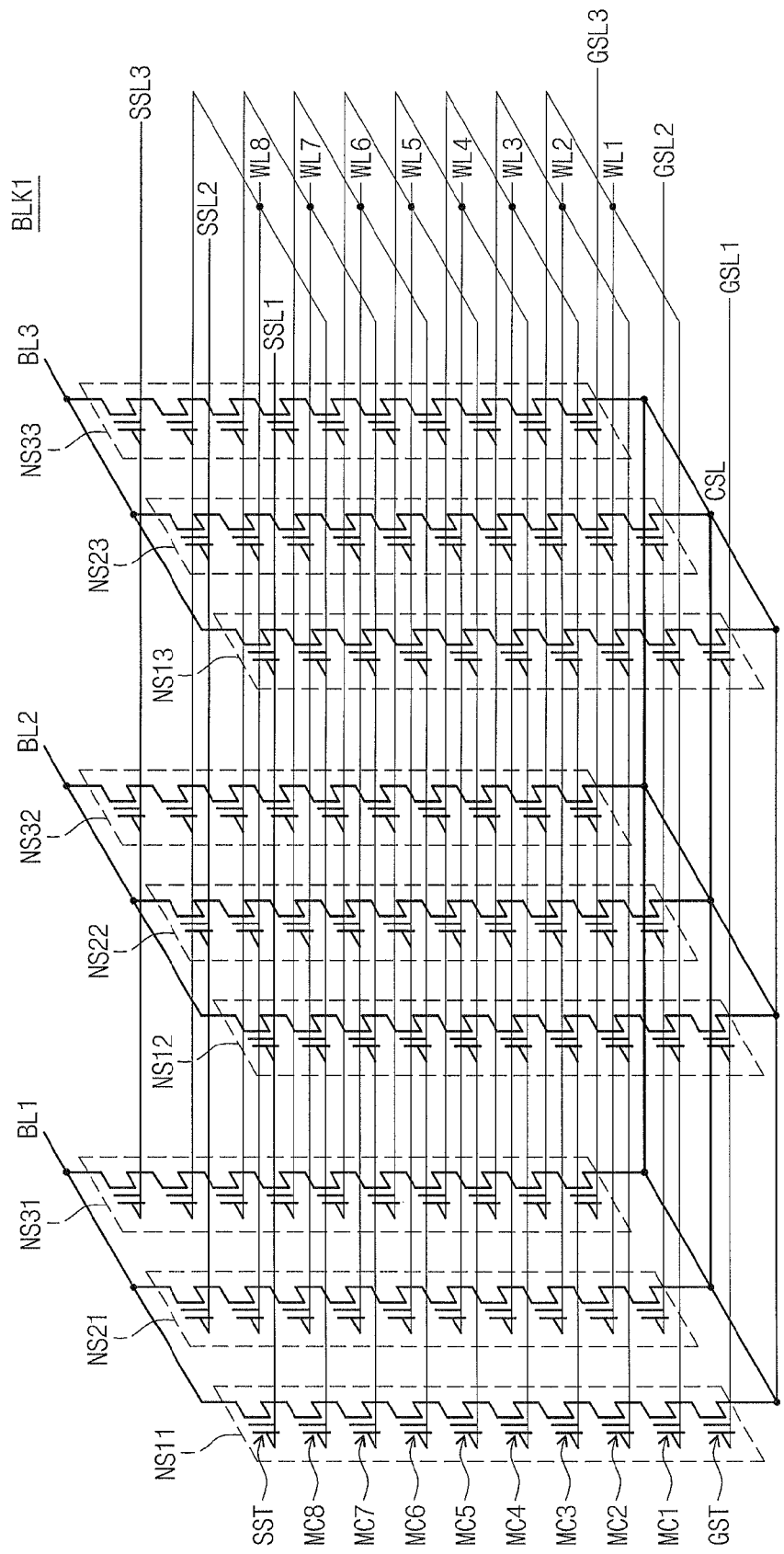
FIG. 29 is an equivalent circuit of the memory block (BLK1) illustrated in FIG. 28.

FIG. 29 is an equivalent circuit of the memory block (BLK1) illustrated in FIG. 28. Referring to FIG. 29, NAND strings NS11~NS33 are connected between bit lines BL1~BL3 and a common source line CSL. Each NAND string (e.g., NS11) includes a string select transistor SST, a plurality of memory cells MC1~MC8 and a ground select transistor GST.

The string select transistor SST is connected to string select lines SSL1~SSL3. The plurality of memory cells MC1~MC8 is connected to corresponding word lines WL1~WL8 respectively. The ground select transistor GST is connected to ground select lines GSL1~GSL3. The string select transistor SST is connected to a bit line BL and the ground select transistor GST is connected to the common source line CSL.

Referring to FIG. 29, the word lines (e.g., WL1) having the same height is connected together in common. The ground select lines GSL1~GSL3 and the string select lines SSL1~SSL3 are separated. In event of programming memory cells (hereinafter it is called a "page') that belong to the NAND strings NS11~NS33 and are connected to the first word line WL1, the first word line WL1 and the first select lines SSL1 and GSL1 are selected.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A nonvolatile memory device comprising:
a memory cell array including first, second and third memory cells, the second memory cell being adjacent to the first memory cell; and
a program control logic circuit controlling the memory cell array,
wherein the program control logic circuit programs the first memory cell and the second memory cell so that the threshold voltage of the first memory cell corresponding to a second erasure state is higher than the threshold voltage of the second memory cell corresponding to data of a first program state,
wherein the second erasure state is an erasure state shifted from a first erasure state and wherein a threshold voltage of the first erasure state is lower than the threshold voltage of the second memory cell.

2. The nonvolatile memory device of claim 1, wherein the third memory cell corresponds to data of a first erasure state, and wherein the program control logic circuit does not perform a programming operation on the third memory cell or performs a programming operation on the third memory cell so that threshold voltage of third memory cell is lower than the threshold voltage of the second memory cell.

3. The nonvolatile memory device of claim 2, wherein the third memory cell is adjacent to at least one non-aggressing memory cell.

4. The nonvolatile memory device of claim 2, wherein the first memory cell is adjacent to a plurality of aggressing memory cells.

5. The nonvolatile memory device of claim 4, wherein the plurality of aggressing memory cells is closest to the first memory cell in a bit line direction and is programmed to a program state having the highest threshold voltage among program states corresponding to the plurality of memory cells.

6. The nonvolatile memory device of claim 1, wherein each of the plurality of memory cells stores 2-bit data and has any one state of five states corresponding to different threshold voltages.

7. A method of programming a nonvolatile memory device having a plurality of nonvolatile memory cells, the method comprising:
programming a first memory cell among memory cells that belong to a first erasure state to a first program state having a threshold voltage higher than the threshold voltage of the first erasure state; and
programming a second memory cell corresponding to data of the first erasure state to a second erasure state having a threshold voltage higher than the threshold voltage of the first program state.

8. The method of claim 7, further comprising programming a third memory cell among memory cells of the first erasure state to a shadow program state having a threshold voltage higher than the threshold voltage of the first program state.

9. The method of claim 8, wherein programming the second memory cell to the second erasure state comprises:
programming the second memory cell to a shadow erasure state using the same verification voltage as used for the shadow program state; and
programming the second memory cell from the shadow erasure state to the second erasure state.

10. The method of claim 9, further comprising programming the third memory cell from the shadow program state to a prime shadow program state using the same verification voltage as used for the second erasure state.

11. The method of claim 10, further comprising programming the third memory cell from the prime shadow program state to a third program state having a threshold voltage higher than the threshold voltage of the second erasure state.

12. The method of claim 7, wherein the step of the programming the second memory cell to the second erasure state is selectively performed on cells adjacent to a plurality of aggressing memory cells.

13. The method of claim 8, further comprising programming the third memory cell from the shadow program state to a second program state having a threshold voltage higher than the threshold voltage of the second erasure state, wherein after programming the third memory cell to the second program state, the second memory cell is programmed to the second erasure state.

14. The method of claim 8, further comprising programming the third memory cell from the shadow program state to a second program state having a threshold voltage higher than the threshold voltage of the second erasure state, wherein after programming the third memory cell to the second program state, the first memory cell is programmed to the first program state.

15. The method of claim 14, wherein the step of the programming the first memory cell to the first program state comprises: programming the first memory cell from the first erasure state to a first shadow program state having a threshold voltage higher than the threshold voltage of the first erasure state; and programming the first memory cell from the first shadow program state to the first program state using a verification voltage higher than that of the first shadow program state.

16. The method of claim 8, further comprising programming the third memory cell from the shadow program state to a second program state having a threshold voltage higher than the threshold voltage of the second erasure state, wherein after programming the third memory cell to the second program state, the first memory cell is programmed to the first program state and wherein after programming the first memory cell to the first program state, the second memory cell is programmed to the second erasure state.

* * * * *